United States Patent [19]
Ellis et al.

[11] Patent Number: 5,831,869
[45] Date of Patent: *Nov. 3, 1998

[54] METHOD OF COMPACTING DATA REPRESENTATIONS OF HIERARCHICAL LOGIC DESIGNS USED FOR STATIC TIMING ANALYSIS

[75] Inventors: Clive Robert Ellis, Scotts Valley, Calif.; Robert J. Palermo, Shoreview, Minn.

[73] Assignee: Unisys Corporation, Blue Bell, Pa.

[*] Notice: This patent issued on a continued prosecution application filed under 37 CFR 1.53(d), and is subject to the twenty year patent term provisions of 35 U.S.C. 154(a)(2).

[21] Appl. No.: 573,015

[22] Filed: Dec. 15, 1995

[51] Int. Cl.⁶ .................................................. H06F 17/50
[52] U.S. Cl. .......................................... 364/490; 364/489
[58] Field of Search ............................ 395/500; 364/578, 364/488, 489, 490, 491

[56] References Cited

U.S. PATENT DOCUMENTS

| | | |
|---|---|---|
| 5,168,455 | 12/1992 | Hooper . |
| 5,168,563 | 12/1992 | Shenoy et al. ........................ 395/500 |
| 5,249,133 | 9/1993 | Batra . |
| 5,262,959 | 11/1993 | Chkoreff . |
| 5,282,147 | 1/1994 | Goetz et al. ............................ 364/489 |
| 5,282,148 | 1/1994 | Poirot et al. . |
| 5,339,253 | 8/1994 | Carrig et al. ............................ 364/489 |
| 5,359,523 | 10/1994 | Talbott et al. . |
| 5,379,231 | 1/1995 | Pillage et al. . |
| 5,384,710 | 1/1995 | Lam et al. . |
| 5,396,435 | 3/1995 | Ginetti . |
| 5,402,357 | 3/1995 | Schaefer et al. . |
| 5,452,228 | 9/1995 | Arakawa et al. . |
| 5,535,145 | 7/1996 | Hathaway ............................. 364/578 |

OTHER PUBLICATIONS

High–Level Modeling using Extended Timing Diagrams, Moeschler (1993).

Fast Timing Analysis of VLSI Circuits: A Dynamic and Hierarchical Approach, Blaquiere and Savaria (1991).

*Primary Examiner*—Kevin J. Teska
*Assistant Examiner*—Dan Fiul
*Attorney, Agent, or Firm*—Charles A. Johnson; Mark T. Starr

[57] ABSTRACT

An automatic process of compacting or "flattening" a hierarchical multi-level logic design for more efficient timing analysis purposes while using electronic design automation tools, the hierarchical multi-level logic design having at least one higher level logic design including at least one instance, but typically a plurality of instances, of a lower level logic design. The process includes creating a file for storing logic design data defining a lower level logic design and timing analysis input data for the lower level logic design, deleting selected logic design data from the file wherein the deleted data represents all internal paths and components of the lower level logic which are not connected to the higher level logic design, thereby leaving only data for external paths and components of the lower level logic design connected to the higher level logic design in the file. The file creation and internal path and component deletion steps are repeated for all lower level logic designs in the overall hierarchical multi-level logic design. Another file is created to hold the logic design data defining the higher level logic design and timing analysis input data for the higher level logic design. The modified logic design data and timing analysis data for the lower level logic designs in the lower level logic design files are automatically substituted into appropriate places in the file for the higher level logic design, thereby decreasing the size of the overall logic design data being processed for timing analysis purposes.

20 Claims, 17 Drawing Sheets

METHOD OF COMPACTING DATA REPRESENTATIONS OF HIERARCHICAL LOGIC DESIGNS USED FOR STATIC TIMING ANALYSIS

BACKGROUND OF THE INVENTION

1. Field of the Invention

This invention relates generally to electronic design automation (EDA) systems used for designing complex integrated circuits and printed circuit boards. The invention is more specifically related to a method of compacting the data representations of complex integrated circuit designs and printed circuit board designs having hierarchical logic boundaries. These data representations are then used as inputs to static timing analysis tools.

2. Background Information

The design process for all integrated circuits is composed of several discrete operations. Initially, the proposed functionality for a circuit is analyzed by one or more chip designers. These designers define the logical components of the circuit and their interactions by specifying the logic design using design capture tools. These design capture tools are commonly implemented in software executing on an engineering workstation computer system, with well-known input devices being used to receive design information from the chip designer and output devices, such as computer displays, being used to provide visual feedback of the design to the designer as it is being constructed. Such software is typically implemented as part of an electronic design automation system. Specifically, the design entry operation involves generating a description of the logic design to be implemented on the circuit chip in an appropriate machine-readable form. Chip designers generally employ hierarchical design techniques to determine the appropriate selection and interconnection of logic and/or memory devices which will enable the chip to perform the desired function. These techniques involve describing the chip's functionality at various levels of abstraction, ranging from the most general function performed by the chip to the precise functions performed by each logic and/or memory element on the chip.

Two common methods for specifying the design are schematic capture and hardware description languages. Both of these methods allow a circuit designer to specify the circuit at the register transfer level (also known as a "behavior description"). The schematic capture method provides a sophisticated user interface which allows a logic circuit to be drawn in graphical form on a computer display. The design is often specified with standard logic symbols such as NAND gates and NOR gates. Using this method, the circuit is defined in small building blocks. The names of the building blocks are specified by the circuit designer. Thus, they usually are logical names with specific functional meaning.

Encoding the design in a hardware description language (HDL) is the other major design entry technique used to specify modern integrated circuits. Hardware description languages are specially developed to aid a designer in describing a circuit. These languages often contain specific functions and syntax to allow complex hardware structures to be described in a compact and efficient way. The HDL program specifying the design may be compiled into the same data format produced by schematic capture, thereby providing a designer great flexibility in methods used for specifying a logic design. The design concepts of libraries, cells, hierarchies, interconnects, etc., are equally applicable to designs specified by a HDL or by schematic capture.

The output of design capture and logic synthesis tools is a logic design database which completely specifies the logical and functional relationships among the components of the design. Once the design is captured, it is necessary to verify that the logic definition is correct and that the circuit implements the function expected by the designer. This verification is currently achieved by timing analysis and simulation tools. The data representation in the logic design database may be reformatted as needed prior to use by the timing analysis and simulation tools. The design undergoes design verification analysis in order to detect flaws in the design. The design is also analyzed by simulating the device resulting from the design to assess the functionality of the design. If errors are found or the resulting functionality is unacceptable, the designer modifies the design as needed. These design iterations help to ensure that the design satisfies its requirements.

Timing analysis tools generally operate on design netlists stored in the logic design database which have been converted to an internal database representation. Each part of the overall system is defined by a netlist. These netlists represent the designs for integrated circuits, printed circuit boards, or backpanels. A printed circuit board design may contain multiple integrated circuit chips (often application-specific integrated circuits (ASICs)), and a backpanel design may contain multiple printed circuit boards. Note how a logical hierarchy exists between the ASICs, printed circuit boards, and backpanels. In the course of performing timing analysis for an entire system, a timing analysis tool may have to operate simultaneously on information from multiple netlists. This concept is shown in the simple example of FIG. 1. FIG. 1 is a prior art block diagram of an example printed circuit board design having two ASICs. The Printed Circuit Board 10 has ASIC 1 12 coupled with ASIC 2 14. The electronic design automation system software generates a netlist for ASIC 1 12 and a netlist for ASIC 2 14. A netlist is also generated for the Printed Circuit Board 10 design, but not to the level of showing the detailed components of the ASIC 1 and ASIC 2. Performing timing analysis for designs such as is pictured in FIG. 1 is slow and cumbersome. For example, suppose a timing violation exists in a path from clocked Flip-Flop 1 (FF 1) 16 through Combinational Logic 18 on ASIC 1 12, through Combinational Logic (CL 2) 20, and then through Pipeline Logic (PL) 22 on ASIC 2 14 to clocked Flip-Flop 2 (FF 2) 24. Let's call this example Path X. Portions of Path X are contained in ASIC 1 12 and ASIC 2 14, while the remainder exists as a board route channel. To locate the timing violation, the timing analyzer must be able to operate on three netlist files: those for the two ASICs, and the third for the Printed Circuit Board 10.

One way to facilitate the timing analysis described above is to combine the complete netlists into one overall netlist or file. For example, merging the ASIC 1, ASIC 2, and Printed Circuit Board netlists for the circuit of FIG. 1 would allow a timing analyzer to directly analyze Path X. Merging netlists can cause problems, however, because even a single netlist file is often very large, taking up large amounts of available disk memory in the electronic design automation system. Merging several netlists can result in a file too large to be loaded into available main memory on the system. Even if the file is loaded onto disk, with just a portion of the file resident in the main memory of the electronic design automation system, the overhead associated with memory spooling makes timing analysis processing prohibitively slow.

Another way to solve the above-stated problem is to perform the timing analysis in a piecemeal fashion. For example, the Path X delay from FIG. 1 could be obtained by initiating three separate timing runs: one for each ASIC design, and a third for the overall Printed Circuit Board design. Delays from each of the three runs could be added together to form the total Path X delay. The resultant delay can then be analyzed to determine if a timing violation will occur. This approach has the disadvantage of requiring human intervention, which is both time-consuming and error-prone.

A third way of performing system-level timing analysis involves using models as substitutes for lower-level entities. The models incorporate delays associated with certain paths within these entities. When the models are substituted into a larger design, a total path delay could be calculated from a single timing run. For example, models could be created for ASIC 1 12 and ASIC 2 14 of FIG. 1 which would allow the calculation of the delay for Path X in the Printed Circuit Board 10 design. While using models decreases the need for manual (i.e., human) intervention, it does not eliminate it entirely. Existing models do not contain enough specific information (for example, actual net names) to pinpoint a timing violation. A designer must cross-reference net names on a netlist with the associated model to determine the net involved in the identified timing violation.

It is apparent that problems currently exist in the prior art for system-level timing analysis of large and complex ASIC, printed circuit board, and backpanel designs. More efficient systems and methods are needed to provide adequate timing analysis of large, complicated systems represented in electronic design automation tools.

SUMMARY OF THE INVENTION

An object of this invention is to compact the data representations of hierarchical multi-level logic designs upon which static timing analysis is performed.

Another object of this invention is to decrease the time required for the integrated circuit and printed circuit board design and test cycle using electronic design automation systems.

Another object of this invention is minimize the time spent performing timing analysis on devices which are part of a logical hierarchy of designs in a complex system.

A further object of this invention is to compact the data representations of hierarchical multi-level logic designs used for performing timing analysis on those logic designs.

Yet another object of this invention is to perform timing analysis on hierarchical logic designs without human intervention.

A still further object of this invention is to provide an efficient way to trace nets across hierarchical boundaries during timing analysis of complex electronic system designs.

Another object of this invention is to minimize the memory space needed to perform timing analysis of complex electronic systems designs having hierarchical logic boundaries.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the Drawings and Description of the Preferred Embodiment, with the scope and aspects of the invention defined in the appended claims.

According to the present invention, the foregoing and other objects and advantages are attained by a novel method for compacting or "flattening" a hierarchical multi-level logic design data representation upon which static timing analysis is performed. The method begins with the step of creating an electronic file to hold the logic design data defining a lower level logic design and timing analysis input data for the lower level logic design. Selected logic design data is deleted from the lower level logic design representation in the electronic file. The deleted data includes definition of all internal paths and components of the lower level logic design which are not connected to a higher level logic design. Hence, only external paths and components of the lower level logic design connected to the higher level logic design remain in the electronic file for the lower level logic design data. These steps are repeated for each lower level logic design defined in the higher level logic design. Any lower level logic design may be specified in one or more instances in the higher level logic design. Another electronic file is created for holding the logic design data defining the higher level logic design and the timing analysis input data for the higher level logic design. The modified logic design data for the lower level logic designs in the lower level logic design electronic files are then substituted into the electronic file for the higher level logic design, thereby decreasing the size of the overall logic design data being processed for timing analysis purposes.

Still other objects and advantages of the present invention will become readily apparent to those skilled in the art from the following detailed description, wherein is shown and described only the preferred embodiment of the invention, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive, and what is intended to be protected by Letters Patent is set forth in the appended claims.

DESCRIPTION OF THE PREFERRED EMBODIMENT

Figure 1:
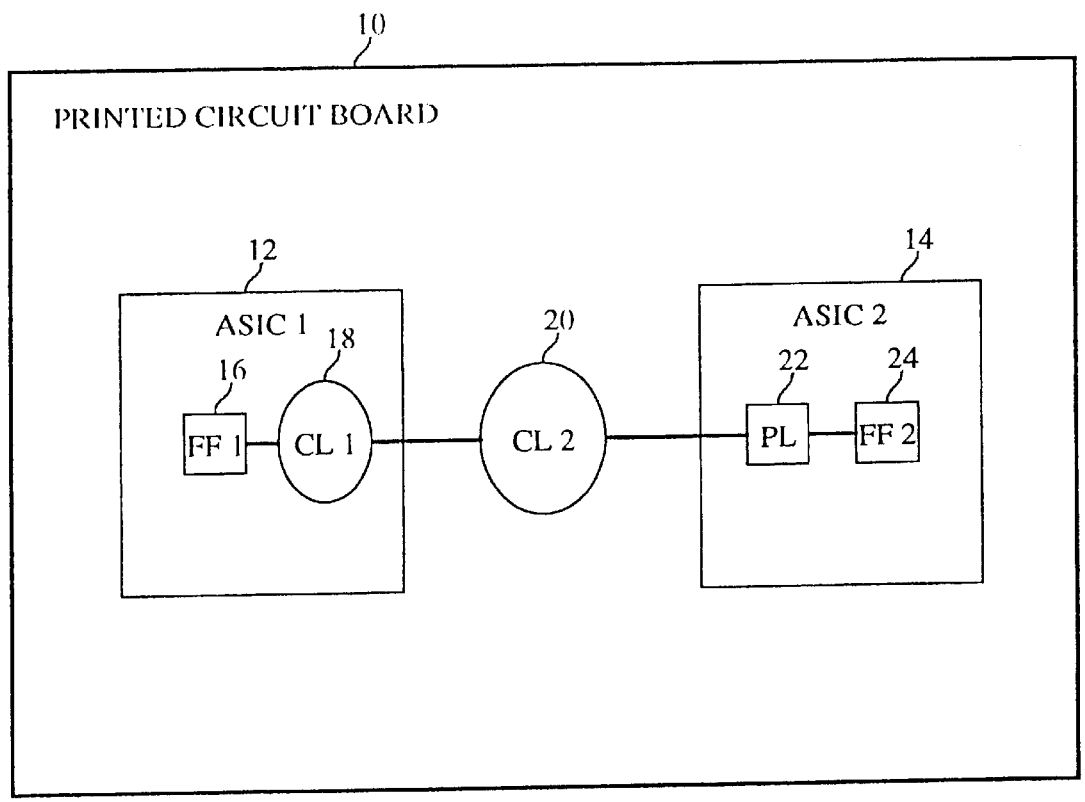
FIG. 1 is a prior art block diagram of an example printed circuit board design having two ASICs.

The detailed descriptions which follow are presented largely in terms of algorithms and symbolic representations of operations on data bits within a computer memory. These algorithmic descriptions and representations are the means used by those skilled in the data processing arts to most effectively convey the substance of their work to others skilled in the art.

An algorithm is here, generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers or the like. It should be kept in mind, however, that all of these and similar terms are to be associated with the appropriate physical quantities and are merely convenient labels applied to these quantities.

Furthermore, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or other similar devices. In all cases, it should be kept in mind the distinction between the method of operating a computer and the method of computation itself. The present invention relates to method steps for operating a computer in processing electrical or other (e.g., mechanical, chemical) physical signals to generate other desired physical signals.

The present invention also relates to apparatus for performing these operations. This apparatus may be specially constructed for the required purposes or it may comprise a general purpose computer as selectively activated or reconfigured by a computer program stored in the computer. The algorithms presented herein are not inherently related to a particular computer system or other apparatus. In particular, various general purpose computer systems may be used with computer programs written in accordance with the teachings of the present invention, or it may prove more convenient to construct more specialized apparatus, to perform the required method steps. The required structure for such machines will be apparent from the description given below.

In sum, the present invention preferably is implemented for practice by a computer, e.g., a source code expression of the present invention is input to the computer to control operations therein. It is contemplated that a number of source code expressions, in one of many computer languages, could be utilized to implement the present invention. A variety of computer systems can be used to practice the present invention, including, for example, a personal computer, an engineering work station, an enterprise server, etc. The present invention, however, is not limited to practice on any one particular computer system, and the selection of a particular computer system can be made for many reasons.

Figure 2:
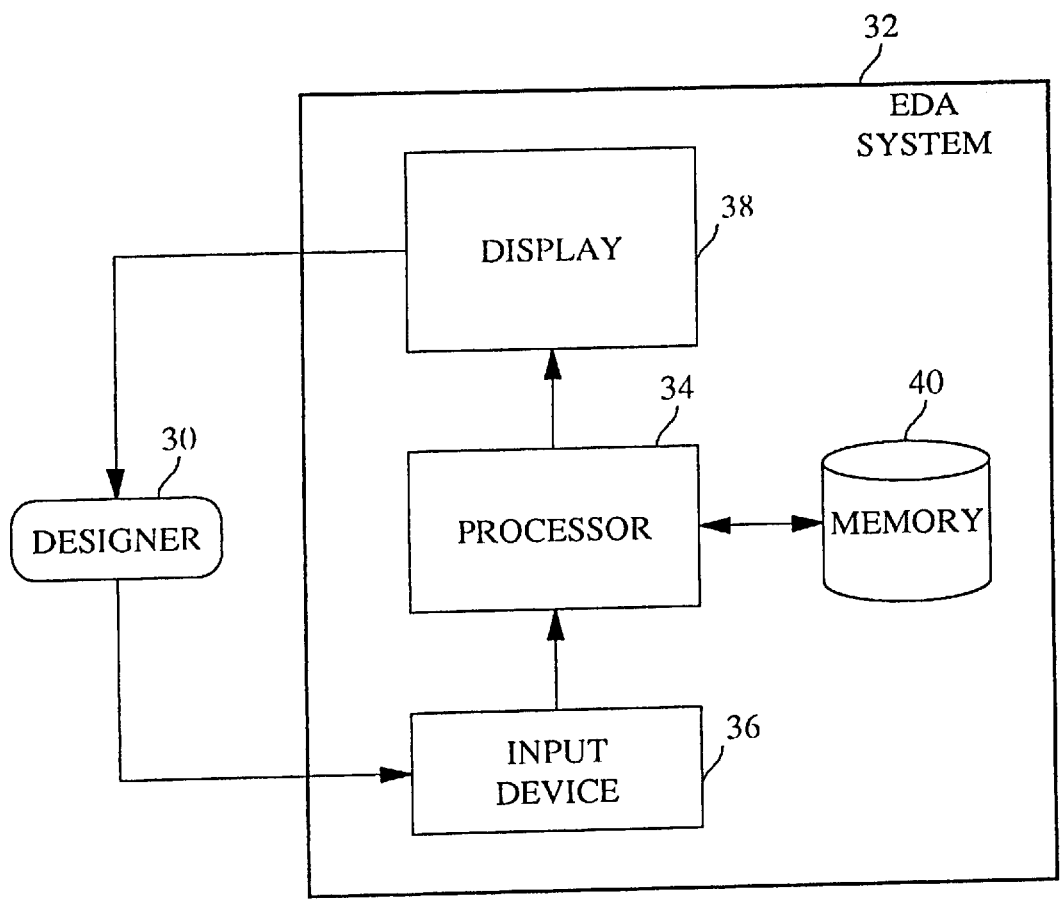
FIG. 2 is a block diagram of the computer-based environment of the present invention.

FIG. 2 is a block diagram of the computer-based environment of the present invention. A Designer 30 interacts with an electronic design automation (EDA) System 32 to enter an integrated circuit or printed circuit board design, validate the design, place the design's components on a chip, and route the interconnections among the components. The integrated circuit may be an application specific integrated circuit (ASIC). The EDA System 32 includes a Processor 34, which executes operating system software as well as application programs known as EDA software. The Processor is found in all general purpose computers and almost all special purpose computers. The EDA System 32 is intended to be representative of a category of data processors suitable for supporting EDA operations. In the preferred embodiment, the EDA System is a HP A1097C Series 700 engineering workstation, commercially available from Hewlett-Packard Corporation, although other engineering workstations or computer systems from manufacturers such as Sun Microsystems, Inc., may also be used. The Designer 30 enters design information into the EDA System by using a well-known Input Device 36 such as a mouse, a keyboard, or a combination of the two devices. It should be understood, however, that the Input Device may actually consist of a card reader, magnetic or paper tape reader, or other well-known input device (including another computer system). A mouse or other cursor control device is typically used as an Input Device as a convenient means to input information to the EDA System to select command modes, edit input data, and the like. Visual feedback of the design process is given to the Designer by showing the design being constructed as graphical symbols on Display 38. The Display is used to display messages and symbols to the Designer. Such a Display 38 may take the form of any of several well-known varieties of CRT displays. The EDA software being executed by the Processor 34 stores information relating to the logic design in Memory 40. The Memory may take the form of a semiconductor memory, magnetic disks, optical disks, magnetic tape or other mass storage device.

Figure 3:
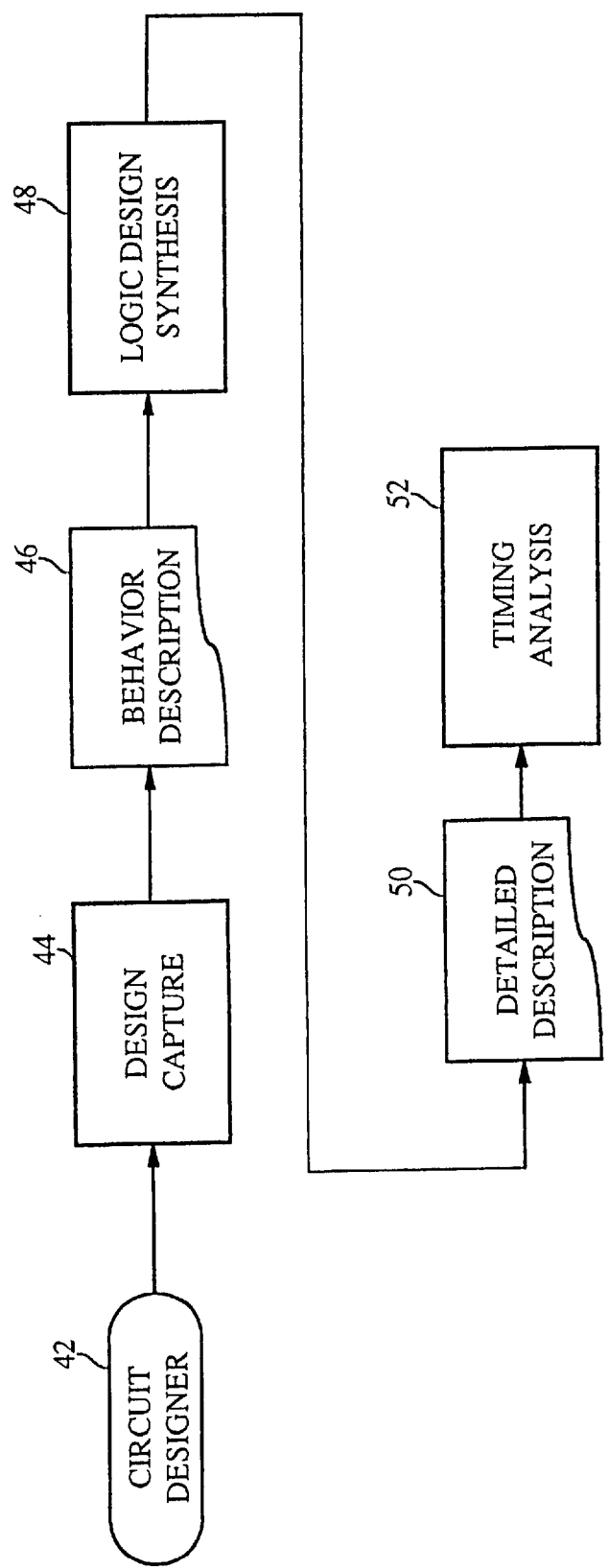
FIG. 3 is a block diagram of the process environment of the present invention.

FIG. 3 is a block diagram of the process environment of the present invention. The Circuit Designer 42 specifies the logic design of an integrated circuit by using Design Capture software 44. In the preferred embodiment, the Hardware Computer-Aided Design System (HCADS), available from Unisys Corporation, is used as Design Capture software 44, although other design capture programs from companies such as Cadence Design Systems, Inc., Synopsys, Inc., and Mentor Graphics, Inc., are also commercially available. The result of this activity is a Behavior Description file 46. The Behavior Description represents the logic design as specified at the register transfer level. Items in the Behavior Description file map to functional components of the design. Each component has a logical state name assigned to it by the Circuit Designer 42. The Behavior Description is input to Logic Design Synthesis software 48. Logic Design Synthesis software 48 creates the gates and other circuitry needed to implement the design specified by the Behavior Description. In the preferred embodiment, the Synthesis software comprises the Behavior to Structure Translator (BEST) synthesis tool developed by Unisys Corporation. However, alternate embodiments such as the VHDL Design Compiler commercially available from Synopsys, Inc., the DesignBook synthesis tool from Escalade, and the Synergy synthesis tool available from Cadence Design Systems, Inc., may also be used. The Synthesis software 48 generates the Detailed Description file 50. This file contains the gate-level definition of the logic design.

The Detailed Description file 50 is input to a variety of other EDA software tools. The Detailed Description is sometimes referred to as the netlist for the design. Timing Analysis software 52 performs timing analysis on the logic design. Timing analysis must be performed on the gate-level implementation, not the logical design, because the drive and fanout of the integrated circuit design will affect the timing analysis, and, if incorrectly inserted, could affect functional results. Therefore, the Detailed Description must be provided to the Timing Analysis software.

In the preferred embodiment, the present invention is implemented in the Timing Analysis 52 software. The prerequisites for performing static timing analysis on a circuit are: the connectivity of the circuit must be known, the state devices of the circuit must be known, and all delays inside the circuit, including macro delays, net delays, setup delays, and hold delays, must be known. Static timing analysis can be performed on a hierarchical logic design if the above prerequisites are met when the hierarchical logic design data is "flattened." The typical case for timing analysis is the need to time a design consisting of at least two hierarchical levels. For example, a design for a printed circuit board may include multiple instances of ASICs. In the two level example, if the lower level designs meet the above prerequisites and the connectivity and net delays of the higher level logic design are known, then a flattened design meeting all of the above prerequisites can be constructed. Flattening the multi-level design is a goal of the present invention.

Figure 4:
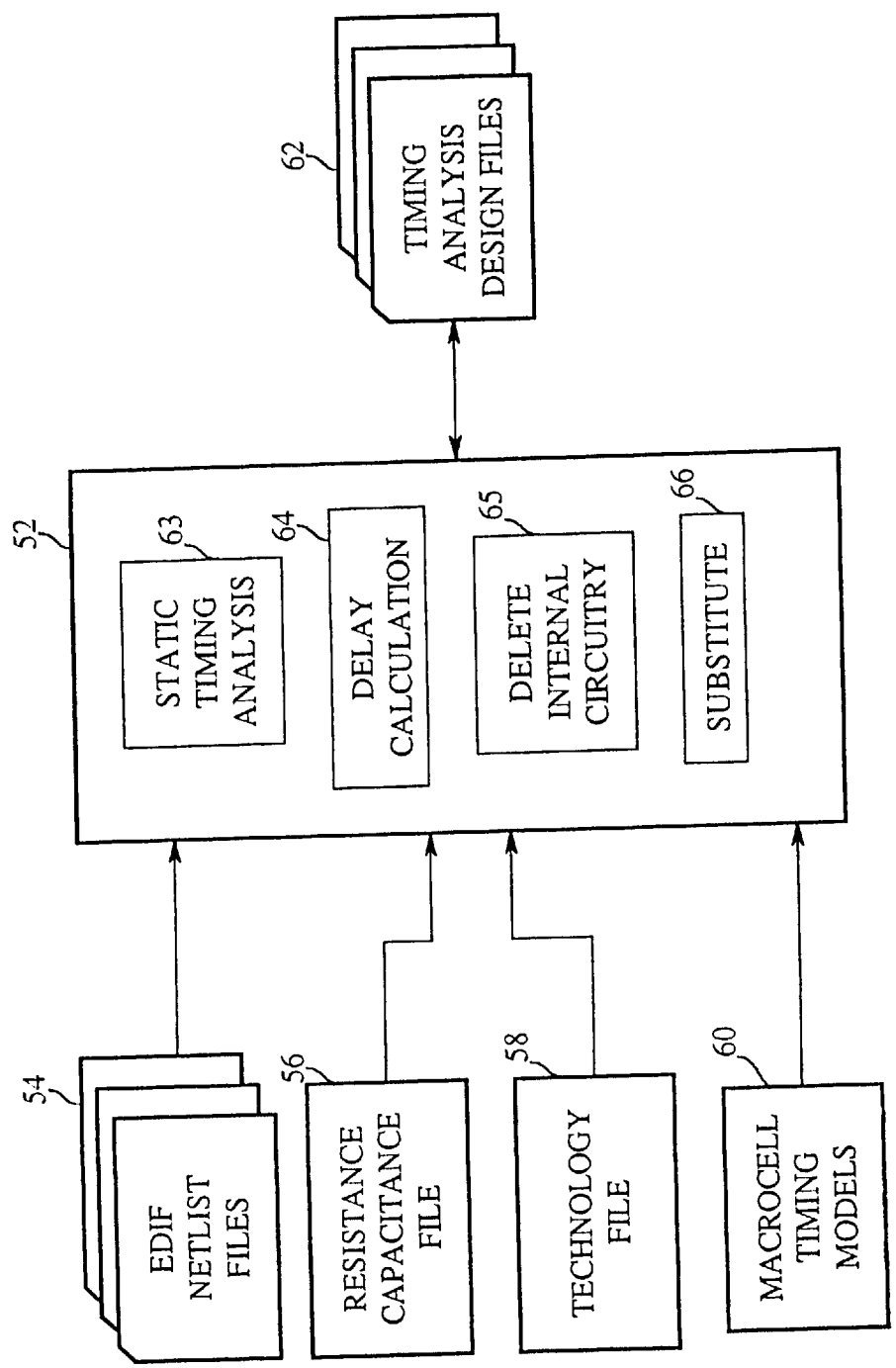
FIG. 4 is a block diagram of the data files used by the Timing Analysis software.

The preferred embodiment of the present invention is Timing Analysis software which operates on design netlists for integrated circuits, ASICs, ASIC subsections, multi-chip modules (MCMs), printed circuit boards (PCBs), backpanels, or other logic design entities. The Timing Analysis software converts these netlists into design files before performing the net tracing and delay calculations associated with conventional timing analysis. FIG. 4 is a block diagram of the data files used by the Timing Analysis software. Timing Analysis 52 reads four files for input data. The Electronic Data Interchange Format (EDIF) Netlist Files 54 contain the Detailed Description 50 of a level of the logic design in an EDIF format. EDIF is a standard format for transferring logic design data between various electronic design automation tools. The Resistance Capacitance (RC) File 56 holds information on the resistance and capacitance factors for the logic cells and nets specified in the EDIF Netlist. The Technology File 58 contains data specific to the design technology of the logic components in the design (e.g., M5C, C5L). Macrocell Timing Models 60 contain cell specific data used to calculate the macro delays (setup, hold, propagation) through the cells. The Timing Analysis software 52 outputs Timing Analysis Design Files 62. These Design Files are internal representations of selected logic designs, including circuit delays. Also included in Timing Analysis software are means for performing conventional Static Timing Analysis 63 and Delay Calculation 64.

The present invention provides for completely automated timing analysis on hierarchical logic designs. Two basic functions are used to implement this invention. The first function is called "Delete Internal Circuitry". The Delete Internal Circuitry function 65 is part of Timing Analysis 52. The second function is called "Substitute". The Substitute function 66 is also part of Timing Analysis 52. The Delete Internal Circuitry function creates a file which is a subset of the original design netlist. This file is one of the Timing Analysis Design Files 62 of FIG. 4. The subset of the original design netlist includes all of the nets and delay information contained in logic paths running between the logic design's state devices (e.g., flip-flops) to external connectors. The Design File 62 also contains delay and net information for the portions of the clock nets associated with the retained state devices. All other internal nets are excluded from the newly-created file. Each time Timing Analysis is executed for a selected lower level logic design (such as an ASIC) of the overall system design (such as a printed circuit board), a new Design File is created. For the ASIC/PCB example, Timing Analysis is executed once for each ASIC design, and then once for the PCB design. The Timing Analysis Design File 62, after being flattened by operation of the present invention, is typically approximately 0.15 times the size of the original EDIF Netlist 54.

Figure 5:
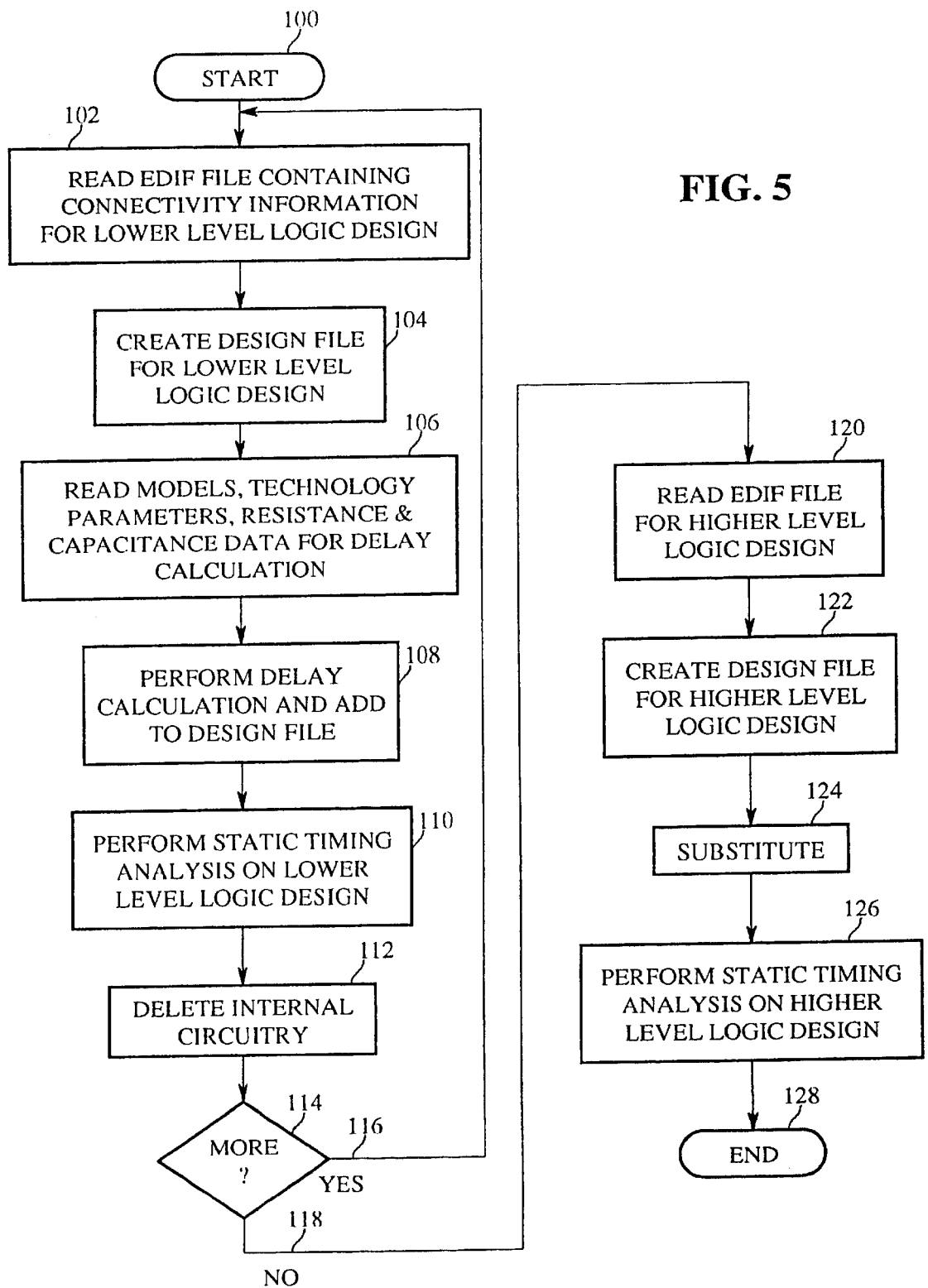
FIG. 5 is a flow chart showing the high-level processing steps for constructing a flattened hierarchical logic design and for performing static timing analysis.

FIG. 5 is a flow chart showing the high-level processing steps for constructing a flattened hierarchical logic design and for performing static timing analysis. After Start Step 100, an EDIF file 54 containing the connectivity information for a lower level logic design is read at Step 102. The lower level logic design could be an ASIC design, or some other system component. At Step 104, a new Design File is 62 created for the lower level logic design. At Step 106, data is read for use in the delay calculation. Data includes macrocell model information from the Timing Models file 60, technology parameters from the Technology File 58, and resistance and capacitance data from the Resistance Capacitance File 56. Next, at Step 108, the delay calculation is performed for the lower level logic design. This action establishes all of the delays needed for performing static timing analysis. These delays are added to the Design File for the lower level logic design. At Step 110, static timing analysis is performed on the lower level logic design. This step is not required to construct a flattened higher level logic design, but it generally performed to ensure that internal lower level logic design timing constraints are met. At Step 112, the Delete Internal Circuitry function is executed to remove the internal connectivity information from the Design File of the lower level logic design. This results in a Design File whose size has been substantially decreased. If, at Test Step 114, more lower level logic designs need to be processed, then Yes path 116 is taken back to Step 102. Otherwise, No path 118 is taken to Step 120.

At Steps 120–126, the higher level logic design (for example, a printed circuit board design) is processed. At Step 120, the EDIF file containing the connectivity information and the net delays for the higher level logic design are read. At Step 122, a Design File is created for the higher level logic design. This Design File includes information on the connectivity and net delays between instances of lower level logic designs as a part of the higher level logic design. At Step 124, the Substitute function is executed to merge the reduced Design Files of the lower level logic designs into the Design File of the higher level logic design. The resulting Design File is a flat representation of the hierarchical logic design containing the appropriate design information, including the appropriate state devices, for performing static timing analysis. At Step 126, static timing analysis is performed on the higher level logic design. This step also analyzes all timing paths in the overall system design that traverse the higher level logic design. Processing ends at End Step 128.

A Timing Analysis Design File 62 is the internal Timing Analysis software representation of a given logic design. It is structured to be used for static timing analysis. It contains five record types: 1) Design, 2) Instance, 3) Net, 4) Pin, and 5) Arc. Each record has a numerical handle. A record is a data structure than can be retrieved by its type or handle. There is one Design record for a logic design. It contains control information about the design such as the number of records of each record type, the design technology type, etc. The Instance records represent the instances of objects in the logic design (circuit), such as logic cells, state devices, ASICs on a PCB, and the like. The key fields in an Instance record are the Instance Name, Instance Type, and First Pin On Instance. The Net records represent the connectivity of the design. The Net records hold data connecting the pins (also known as ports) in the circuit. The key fields of a Net record are the Net Name and the First Pin On Net. The Pin records represent the ports (or terminals) that reside on the Instances of the circuit. A pin is a terminal instance connected to a macrocell. Pins also represent the primary circuit pins. The key fields in the Pin record are the Pin Name, Pin Type, Parent Instance, Next Pin On Instance, Parent Net, Next Pin On Net, First Source Arc, and First Destination Arc. The Arc records represent the delays between pins in the design. They can represent all delay types, including net propagation, macro propagation, setup, and hold. The key fields in an Arc record are the Arc Type, Source Pin, Source Transition, Destination Pin, Destination Transition, Minimum Delay, Typical Delay, Maximum Delay, Next Destination Arc For Source Pin, and Next Source Arc For Destination Pin.

Figure 6:
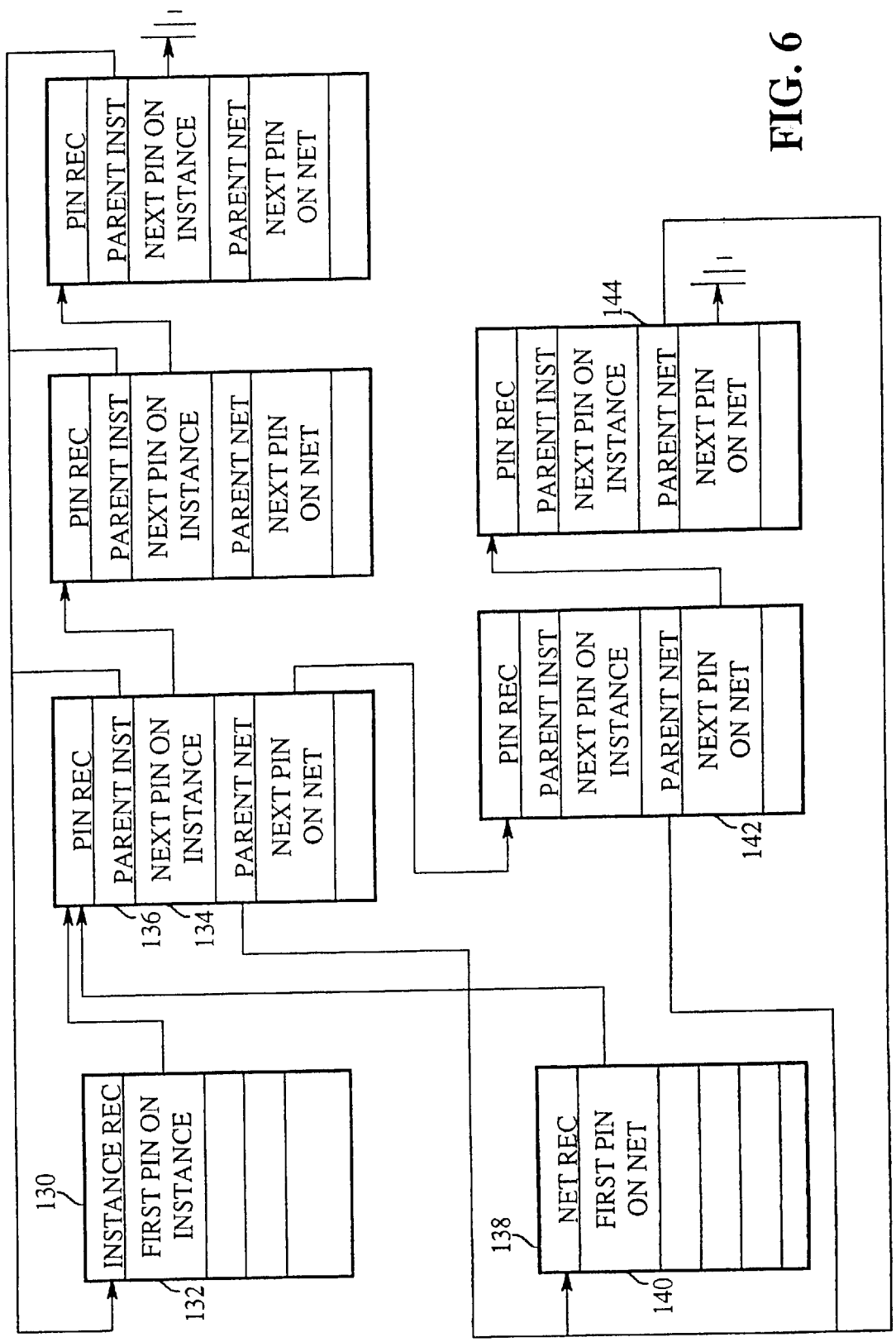
FIG. 6 is a diagram illustrating a portion of a sample Design File showing the Instance-Net-Pin relationships.

FIG. 6 is a diagram illustrating a portion of a sample Design File showing the Instance-Net-Pin relationships. Note how an Instance record 130 links a list of Pin records via the First Pin On Instance pointer field 132. Each Pin record has a Next Pin On Instance field 134 linking additional Pins to this Instance, as well as a Parent Instance field 136 functioning as a back pointer to the Instance record 130. A second linked list in the Design File links Net records with Pin records. Note how Net record 138 uses its First Pin On Net field 140 to link Pin records. Each Pin record has a Next Pin On Net pointer field 142 to store the Net to Pin relationship. Each Pin record also has a back pointer field called the Parent Net field 144 for linkage back to the Net record 138. One skilled in the art can readily see how relationship information between Instances, Nets, and Pins can be stored and accessed according to the Design File definition.

Figure 7:
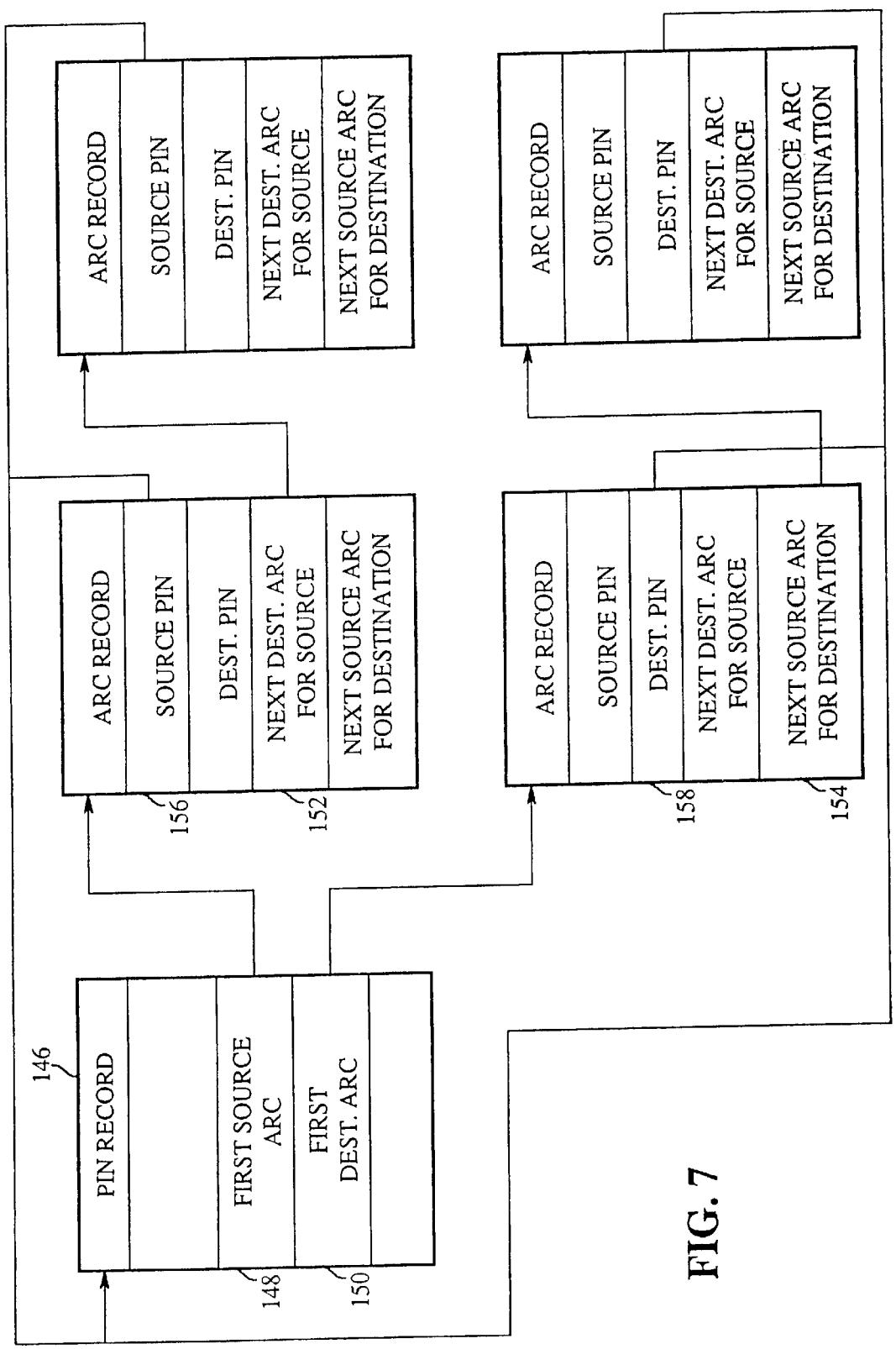
FIG. 7 is a diagram illustrating a portion of a Design File showing the Pin-Arc relationship.

FIG. 7 is a diagram illustrating a portion of a Design File showing the Pin-Arc relationship. Note how a Pin record 146 links a list of source Arc records via the First Source Arc pointer field 148, and a list of destination Arc records via the First Destination (Dest.) Arc pointer field 150. Each Arc record has a Next Destination Arc For Source field 152 for linking additional Arc records to a Source list. Each Arc record also has a Next Source Arc For Destination field 154 for linking additional Arc records to a Destination list. Each Arc record in a Source list has a Source Pin field 156 pointing back to the Pin record 146. Each Arc record in a Destination list has a Destination Pin field 158 pointing back to the Pin record 146. One skilled in the art can readily see how relationship information between Pins and Arcs can be stored and accessed according to the Design File definition.

A reduced Design File has a substantial portion of the internal interconnect information of a lower level design removed from the original Design File. More precisely, it is a Design File which contains only paths that are needed in order to interface with the next higher level Design File in the design hierarchy. In a typical case, the reduced Design File is that of an ASIC which occurs as instances on a Printed Circuit Board (PCB) design. A reduced Design File contains only those record entities that are necessary for it to be integrated into a Design File at the next higher hierarchical logic level. Accordingly, it must contain all record entities to support the storage of all data paths between the ASIC primary pins (both inputs and outputs) and the first tier state devices in the design. No data paths beyond these state devices are retained. However, in order to support the data paths just described, all clock and enable paths that reach these state devices must also be retained. Setup, hold, and internal propagation arcs relating the data pins and clock pins on the state devices must also be retained.

Figure 8:
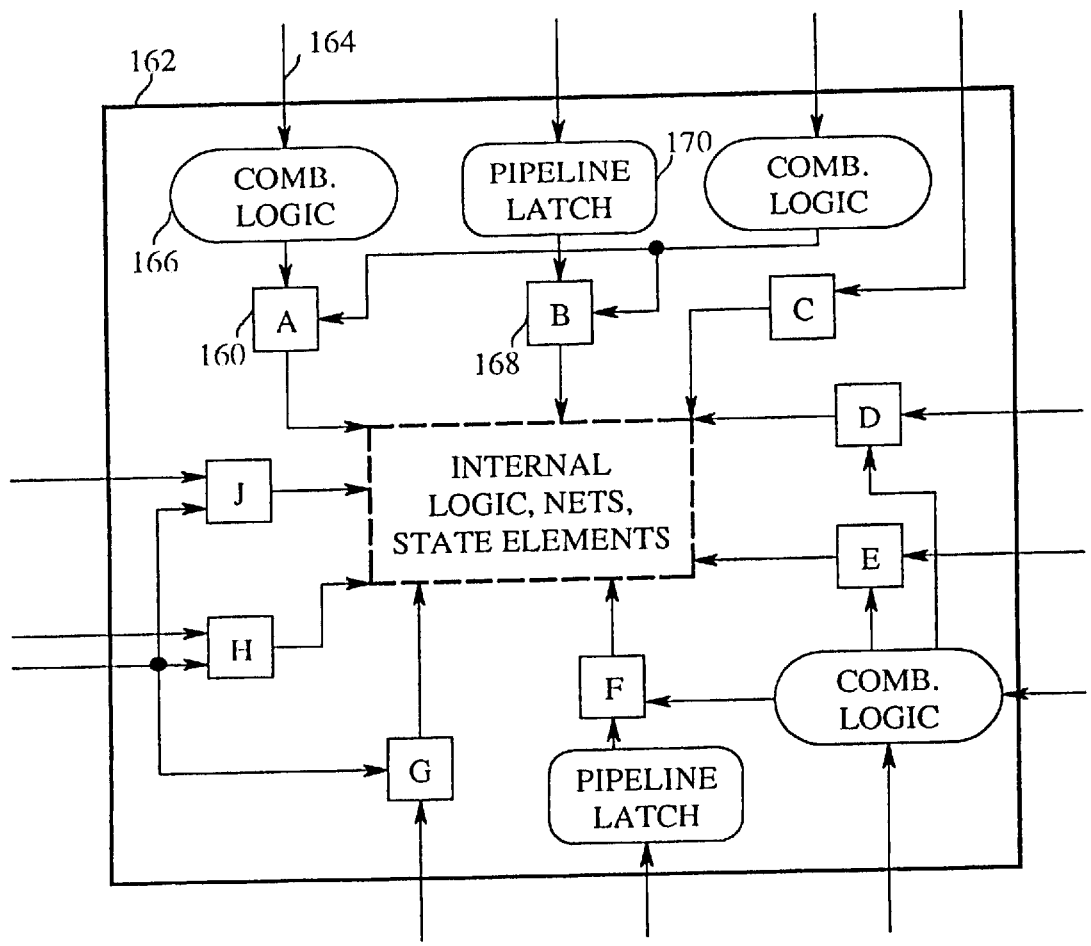
FIG. 8 is a block diagram of an example of a lower level (ASIC) design before implementation of the Delete Internal Circuitry function.
Figure 9:
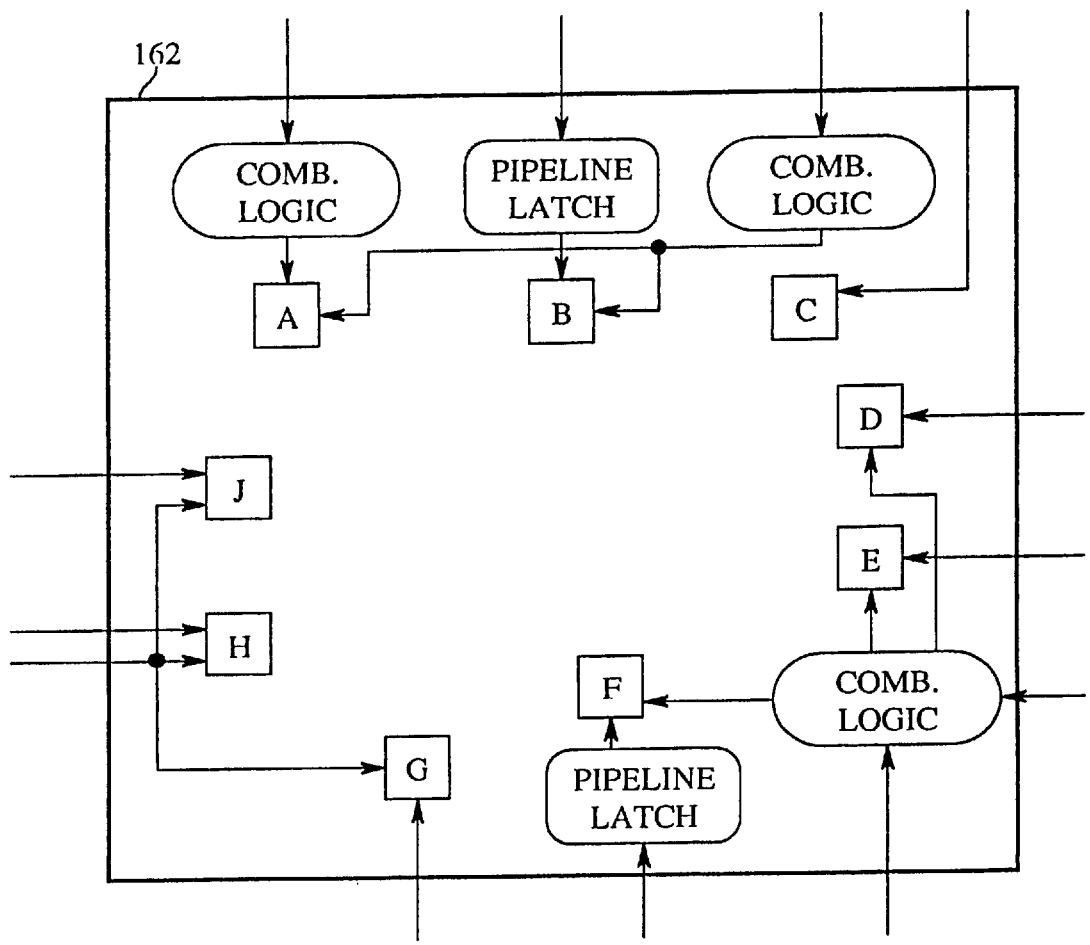
FIG. 9 is a block diagram of the example lower level (ASIC) design after the internal circuitry has been deleted from the Design File.

FIG. 8 is a block diagram of an example of a lower level (ASIC) design before implementation of the Delete Internal Circuitry function. The Design File resulting from execution of the Delete Internal Circuitry function contains all of the nets included in logic paths running between flip-flops and external pins. Some of these paths include combinational logic, while others include state devices operating in pipeline (flow-through) mode. All net and delay information associated with these paths is retained. For example, the logic path between Flip-Flop A 160 in ASIC 162 and the corresponding ASIC pin 164 contains Combinational Logic 166. As such, all nets and delay information associated with this Combinational Logic are retained. Likewise, the logic path associated with Flip-Flop B 168 contains a Pipeline Latch 170. Since this latch allows data flow-through, delay and net information associated with this device is saved in the Design File. Finally, delay and net information associated with the clock paths of Flip-Flops A through J are also retained. FIG. 9 is a block diagram of the example lower level (ASIC) design after the internal circuitry has been deleted from the Design File.

The above example shows how the Delete Internal Circuitry function operates on a lower level design such as an ASIC netlist. The function is equally effective in reducing netlists associated with ASIC subsections, printed circuit boards, or any other logic partition.

The Delete Internal Circuitry process consists of five basic steps. The first two steps of the Delete Internal Circuitry process result in the marking of the relevant data Pins, the Instances and Nets associated with these Pins, and the propagation Arcs (Net Propagation Arcs between Instances and Macro Propagation Arcs inside Instances) associated with these Pins. The next two steps result in the marking of the relevant clock and enable Pins, the Instances and Nets associated with these Pins, and the setup and hold Arcs needed to support the data network established in the first two steps. The last step physically creates the reduced Design File by keeping only those records that were marked and by storing them in the form of a Design File.

Figure 10:
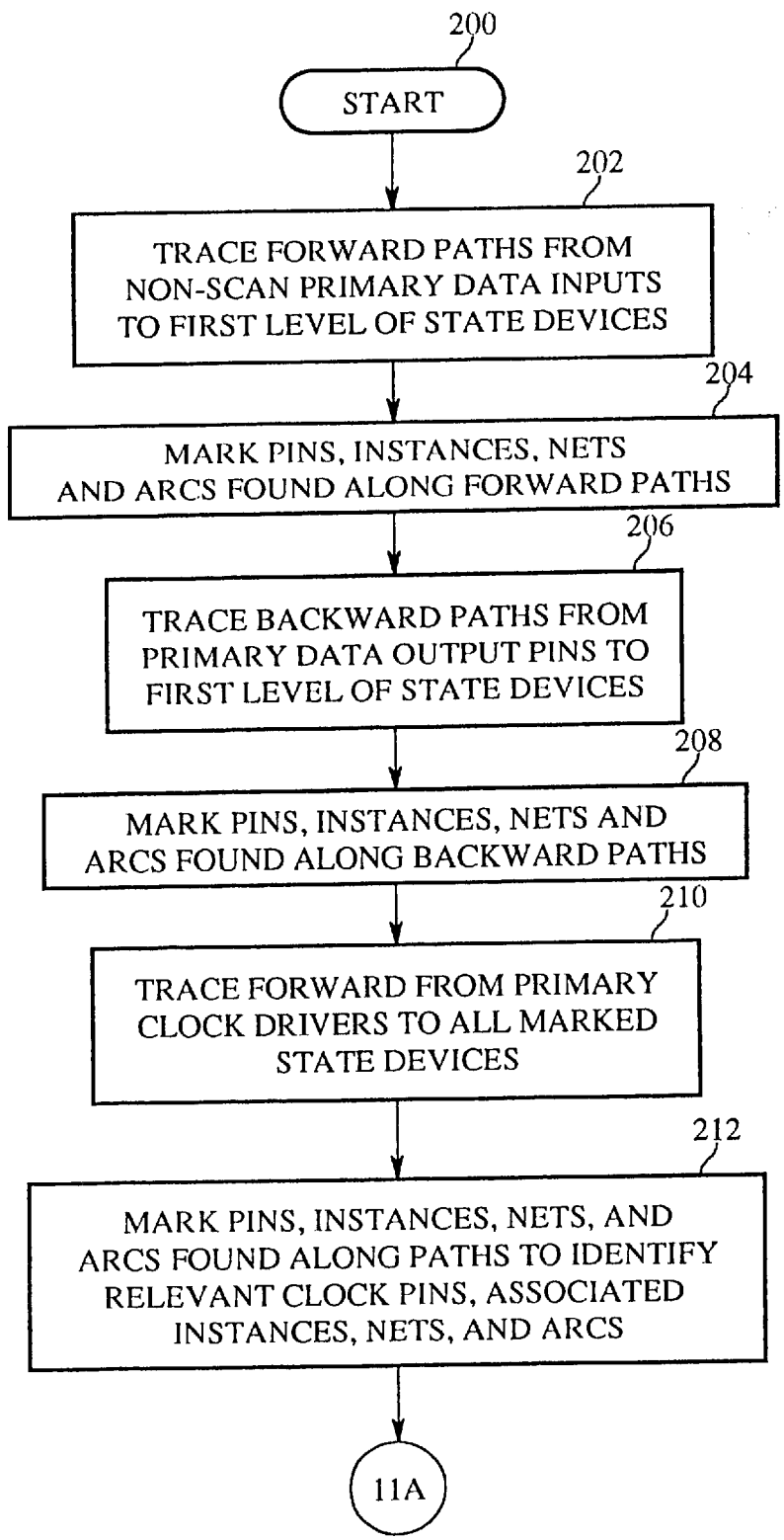
FIG. 10 and FIG. 11 are flow charts showing the steps for the Delete Internal Circuitry function.
Figure 11:
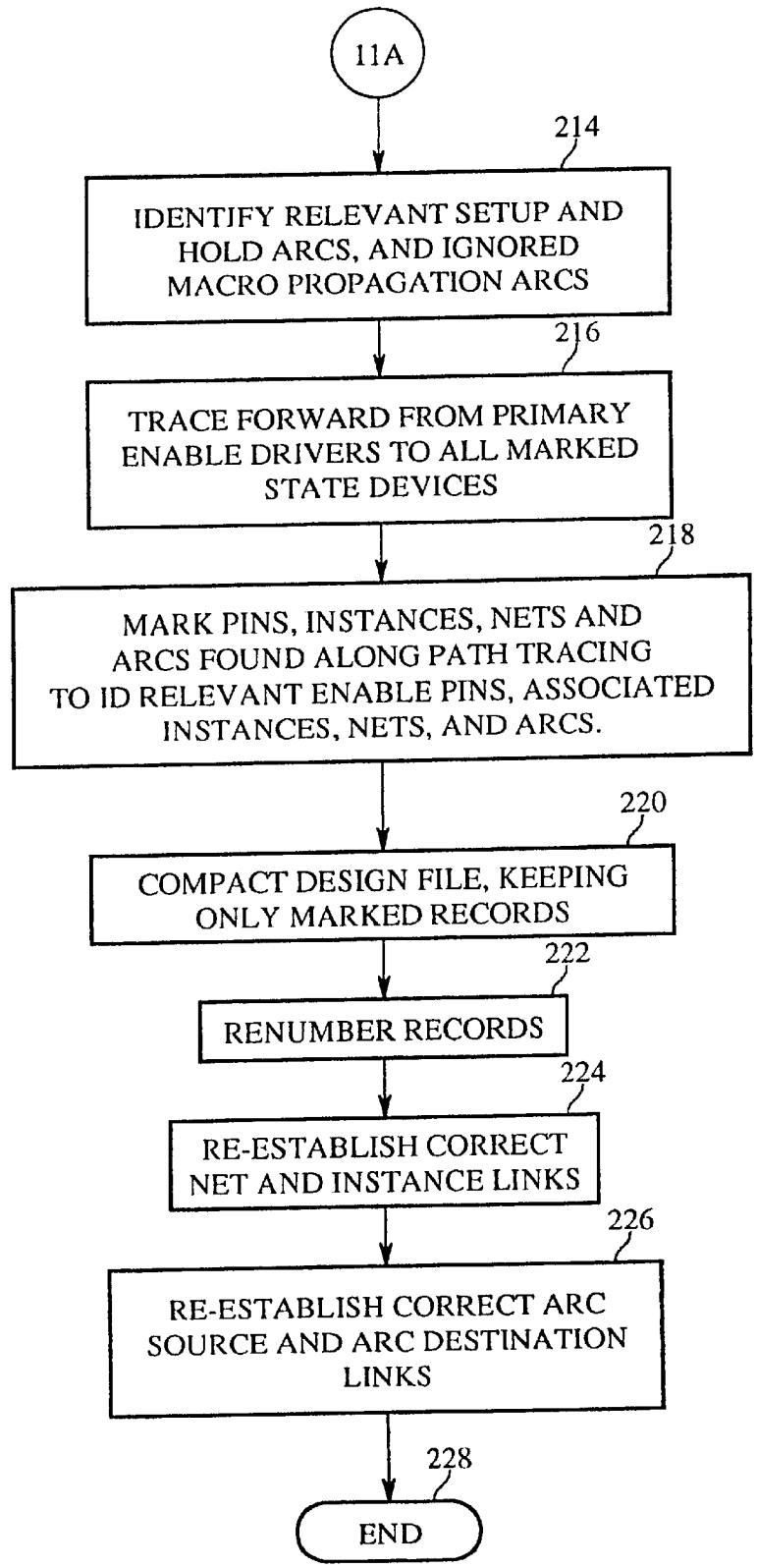

FIG. 10 and FIG. 11 are flowcharts showing the steps for the Delete Internal Circuitry function. After Start Step 200 on FIG. 10, the forward paths from a lower level design's non-scan primary data input Pins are traced to the first level of state devices at Step 202. Next, at Step 204, the Pins, Instances, Nets, and Arcs that are encountered along the forward paths are marked so that they are retained for subsequent processing. At Step 206, the Pins, Instances, Nets, and Arcs that are encountered along the backward paths from the design's primary data output Pins are traced to the first level of state devices. At Step 208, the Pins, Instances, Nets, and Arcs found along the backward paths are marked so that they are retained for subsequent processing. The clock drivers are handled next. At Step 210, forward tracing from the design's primary clock drivers to all state devices that were previously marked is performed. All Pins, Instances, Nets, and Arcs found along these traced paths are marked at Step 212 to identify relevant clock Pins, their associated Instances and Nets, and the Propagation Arcs associated with these Pins. Delete Internal Circuitry processing continues on FIG. 11 via connector 11A.

At Step 214 on FIG. 11, the relevant setup and hold Arcs, and the macro propagation Arcs that may have been ignored during the data tracing, are identified. The clock tracing also marks any logic (non-state devices) that the clocks trace through. Next, at Step 216, forward tracing from the design's primary enable drivers to all state devices that were previously marked is performed. All Pins, Instances, Nets, and Arcs found along the forward tracing paths are marked at Step 218 to identify relevant enable Pins, their associated Instances and Nets, and the Propagation Arcs associated with these Pins. The Design File is then compacted at Step 220. Only records that have been marked are kept in the Design File. This step reduces the size of the Design File by as much as 85%. At Step 222, the remaining records in the Design File are renumbered so that they have consecutive identifiers. Next, at Step 224, the correct Net and Instance links are re-established. Finally, at Step 226, the correct Arc source and Arc destination links are re-established, and processing ends at End Step 228.

The steps described above are performed for each lower level logic design represented as a Design File. The result of this processing is a set of compacted Design Files representing the perimeter logic connections for the lower level logic designs present within a higher level logic design.

After the Delete Internal Circuitry function has created the subset Design Files, the "Substitute" function allows these files to be merged into the netlist of a higher-level entity in the overall logic design of the system. As noted above, the prerequisites for performing static timing analysis on a circuit are: the connectivity of the circuit must be known, the state devices of the circuit must be known, and all delays inside the circuit, including macro delays, net delays, setup delays, and hold delays, must be known. Static timing analysis can be performed on a hierarchical logic design if the above prerequisites can be met when the hierarchical logic design is flattened. Creating a flattened design from two levels of logic hierarchy can be achieved by merging the lower level logic designs onto their appropriate instances in the higher level logic design. In the preferred embodiment, this involves merging lower level reduced Design Files onto their instances in the higher level Design File. The process for merging reduced Design Files onto a higher level Design File is performed by the "Substitute" function.

Figure 12:
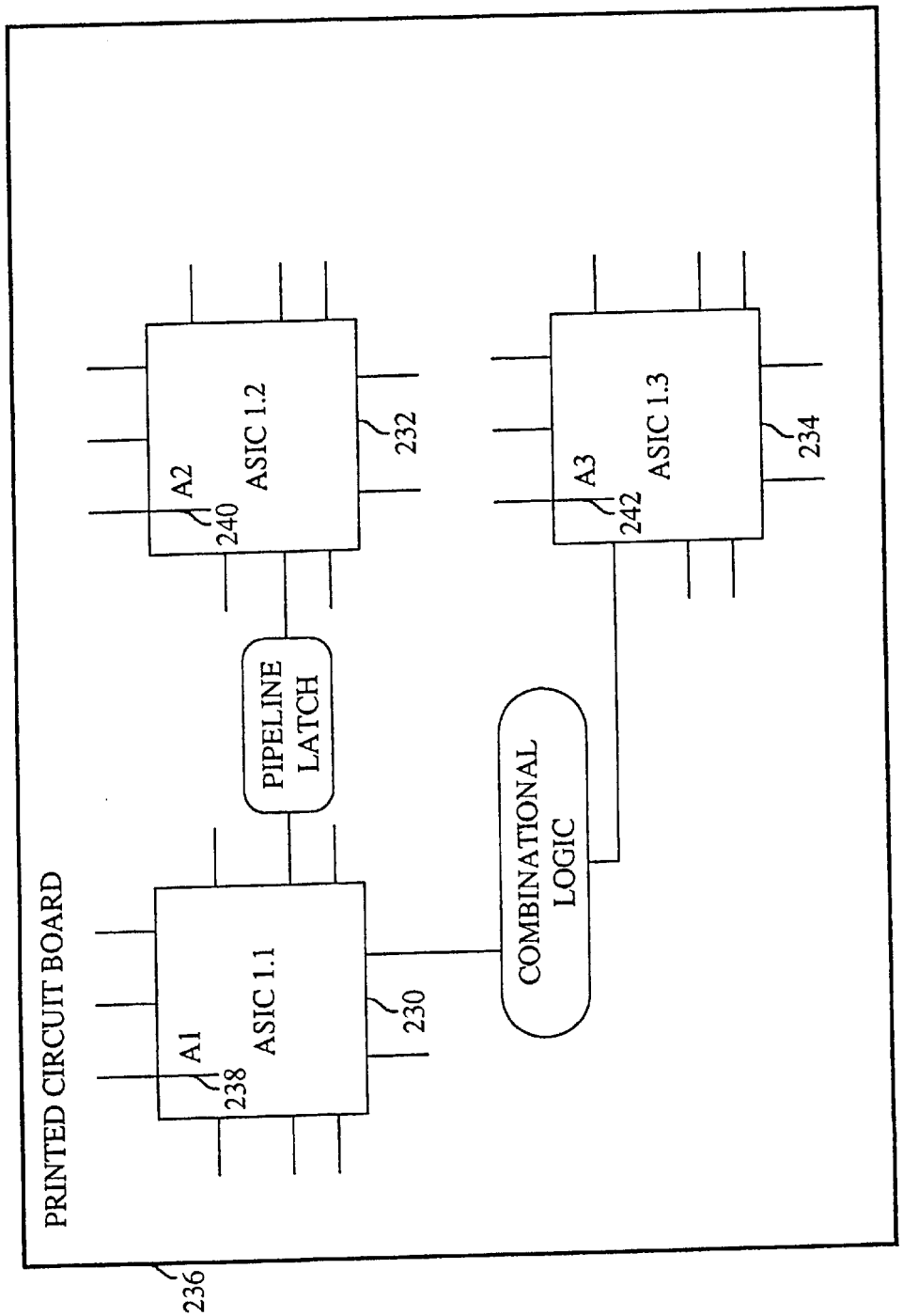
FIG. 12 is a block diagram showing a representation of a board netlist being merged with the subset netlist of FIG. 9.

During the merge process, the internal ASIC Nets may be renamed to reflect multiple Instances of each device. FIG. 12 is a block diagram showing a representation of a board netlist being merged with the subset netlist for FIG. 9. The ASIC Nets are named to reflect the fact that three ASICs (ASIC 1.1 230, ASIC 1.2 232, and ASIC 1.3 234) of the same type are resident on the Printed Circuit Board 236. Note how the internal Pin names reflect the multiple Instances of the ASIC. For example, the Net A has three Instances, A1 238, A2 240, and A3 242.

Figure 13:
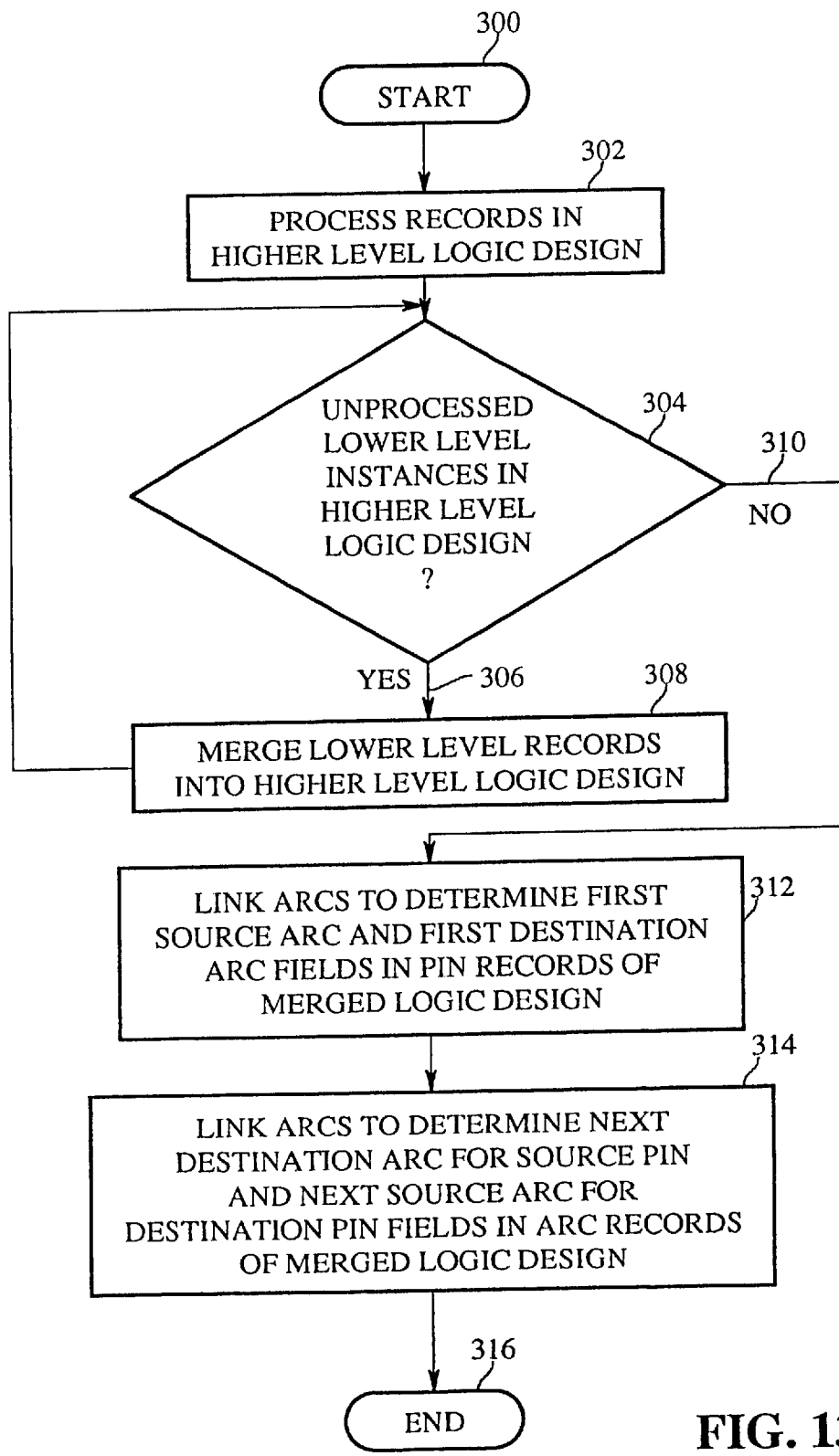
FIG. 13 is a flow chart showing the steps for performing the Substitute function.

FIG. 13 is a flow chart showing the steps for performing the Substitute function. After Start Step 300, the records in the Design File for the higher level logic design are processed at Step 302. Further details of this step are discussed below and shown in FIG. 14. Next, for each Instance in the higher level logic design for which a lower level Design File is to be substituted, a corresponding record will be merged into the higher level logic design. Thus, at Test Step 304, if there are still unprocessed lower level Instances in the higher level logic design, then Yes path 306 is taken to Step 308. At Step 308, the lower level records are merged into the higher level logic design. Further details of this step are discussed below and shown in FIG. 15 through FIG. 17. After the Instance is processed by merging, processing continues with Test Step 304. If no unprocessed lower level Instances remain in the higher level logic design, then No path 310 is taken to Step 312. At this step, the Arcs are linked to determine the First Source Arc and First Destination Arc fields in the Pin records. At Step 314, the Arcs are linked to determine to the Next Destination Arc for Source Pin and Next Source Arc for Destination Pin fields in Arc records. Substitute processing ends at End Step 316. The logic design is now flattened and in a state that allows for efficient performance of static timing analysis.

Figure 14:
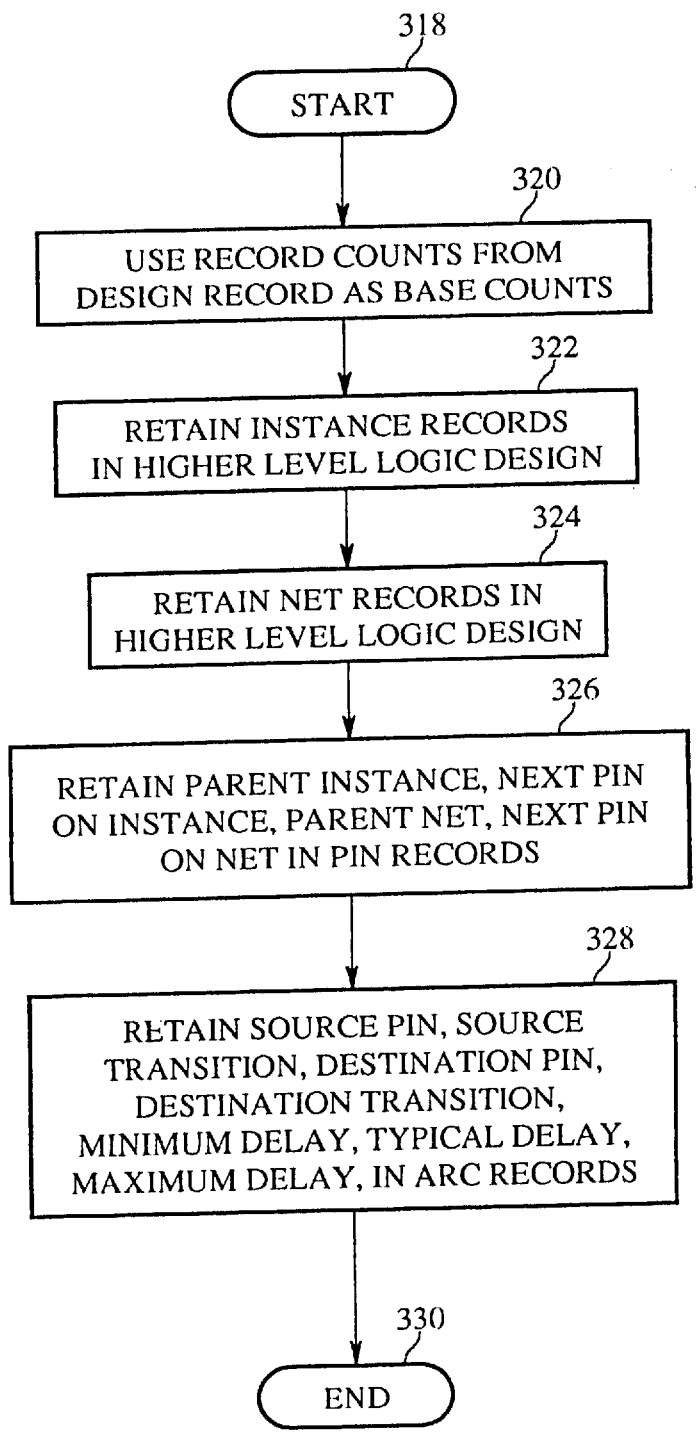
FIG. 14 is a flow chart showing the steps for processing records in the higher level logic design.

FIG. 14 is a flow chart showing the steps for processing records in the higher level logic design. After Start Step 318, the Design File record counts are used as base counts during the merge at Step 320. The final record counts will be known after all lower level logic Design Files are merged into the higher level logic design. Instance records in the higher level logic design do not need to be changed. They also retain their original handles. A handle is a numerical record identifier. At Step 322, the Instance records are retained in the higher level logic design. Note that the First Pin On Instance field is valid because higher level Pin records will retain their handles. Net records in the higher level logic design do not need to be changed and, similarly, retain their original handles. Thus, at Step 324, the Net records are retained in the higher level logic design. At Step 326, the Parent Instance, Next Pin On Instance, Parent Net, Next Pin On Net fields in the Pin records are retained. These fields are still valid because the handles of the records which they reference do not change. The First Source Arc and First Destination Arc fields will be determined when Arcs are linked as in Step 312 of FIG. 13. The Pin records also retain their original handles. At Step 328, the Source Pin, Source Transition, Destination Pin, Destination Transition, Minimum Delay, Typical Delay, and Maximum Delay fields all remain valid and are retained. The Arc records also retain their original handles. The Next Destination Arc for Source Pin fields and the Next Source Arc for Destination fields are determined when Arcs are linked as in Step 314 of FIG. 13. Higher level logic design record processing ends at End Step 330.

Figure 15:
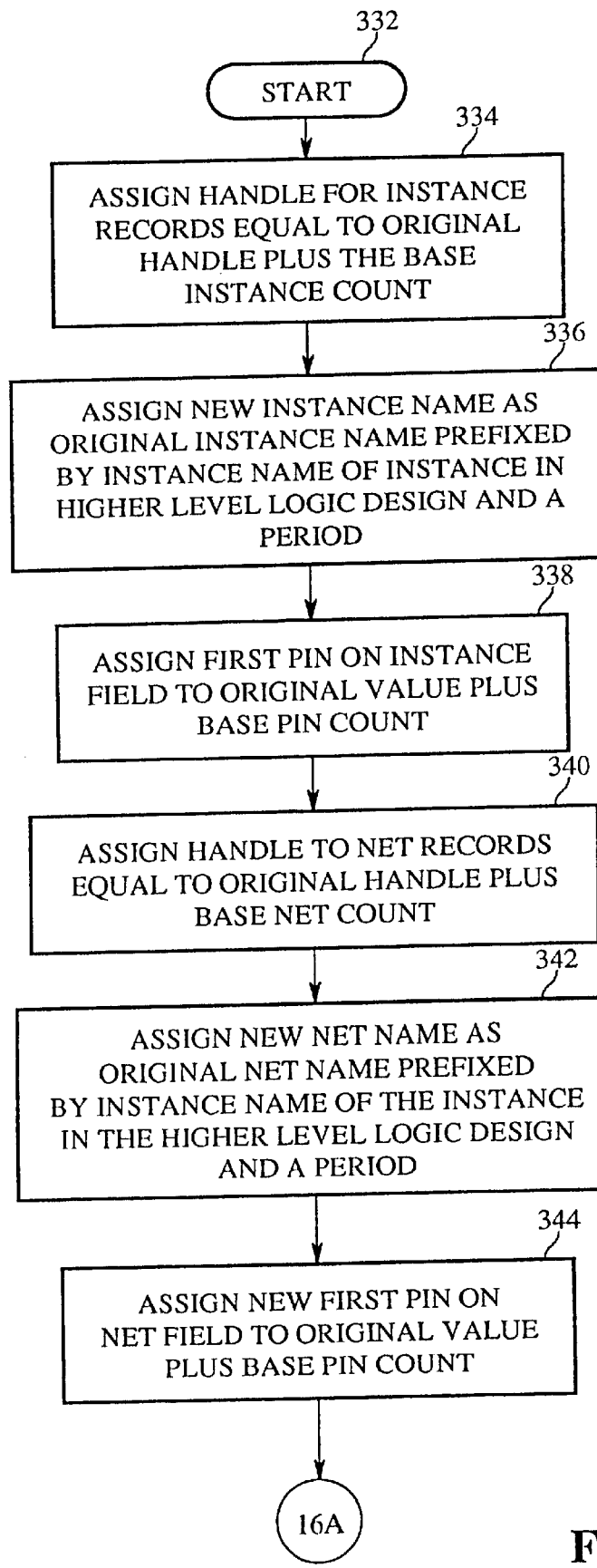
FIG. 15 through FIG. 17 are flow charts showing the steps for merging lower level design records into a higher level logic design.
Figure 16:
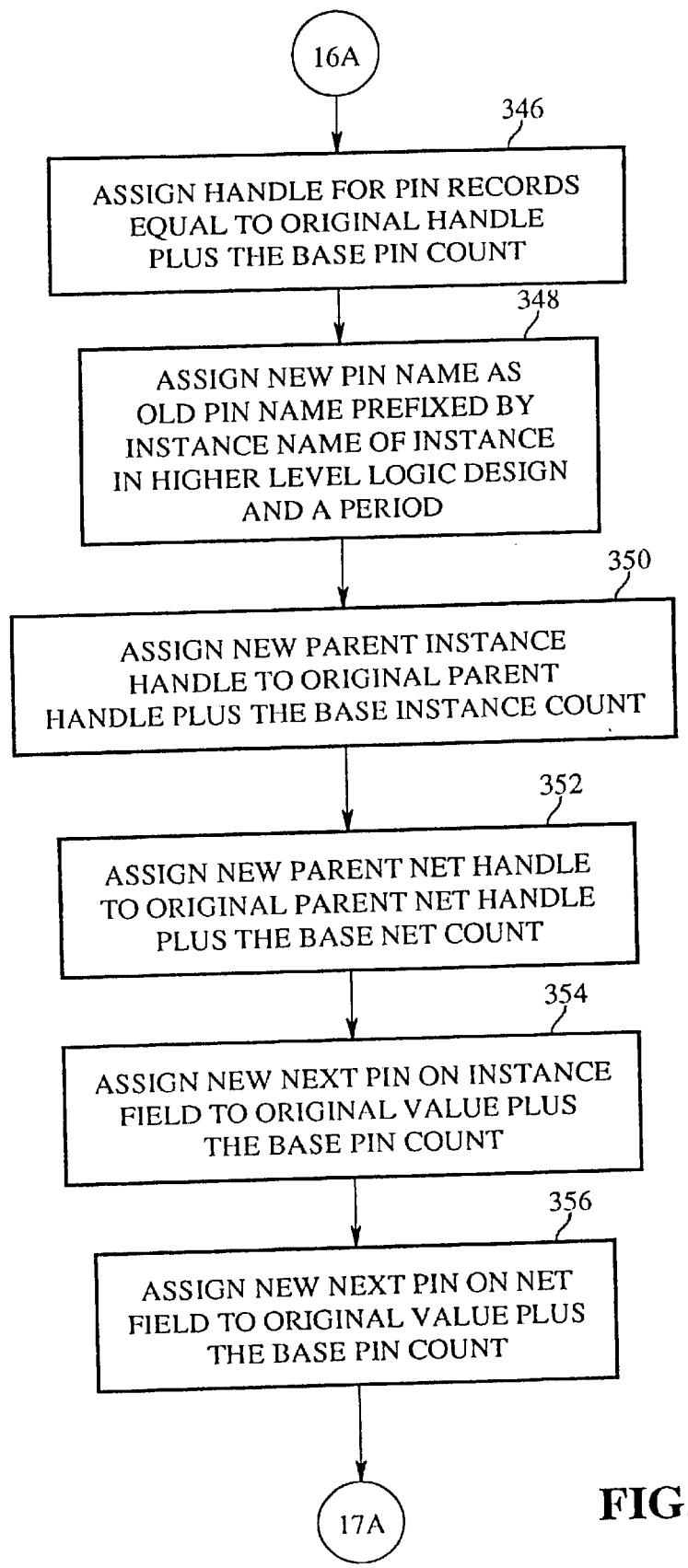
Figure 17:
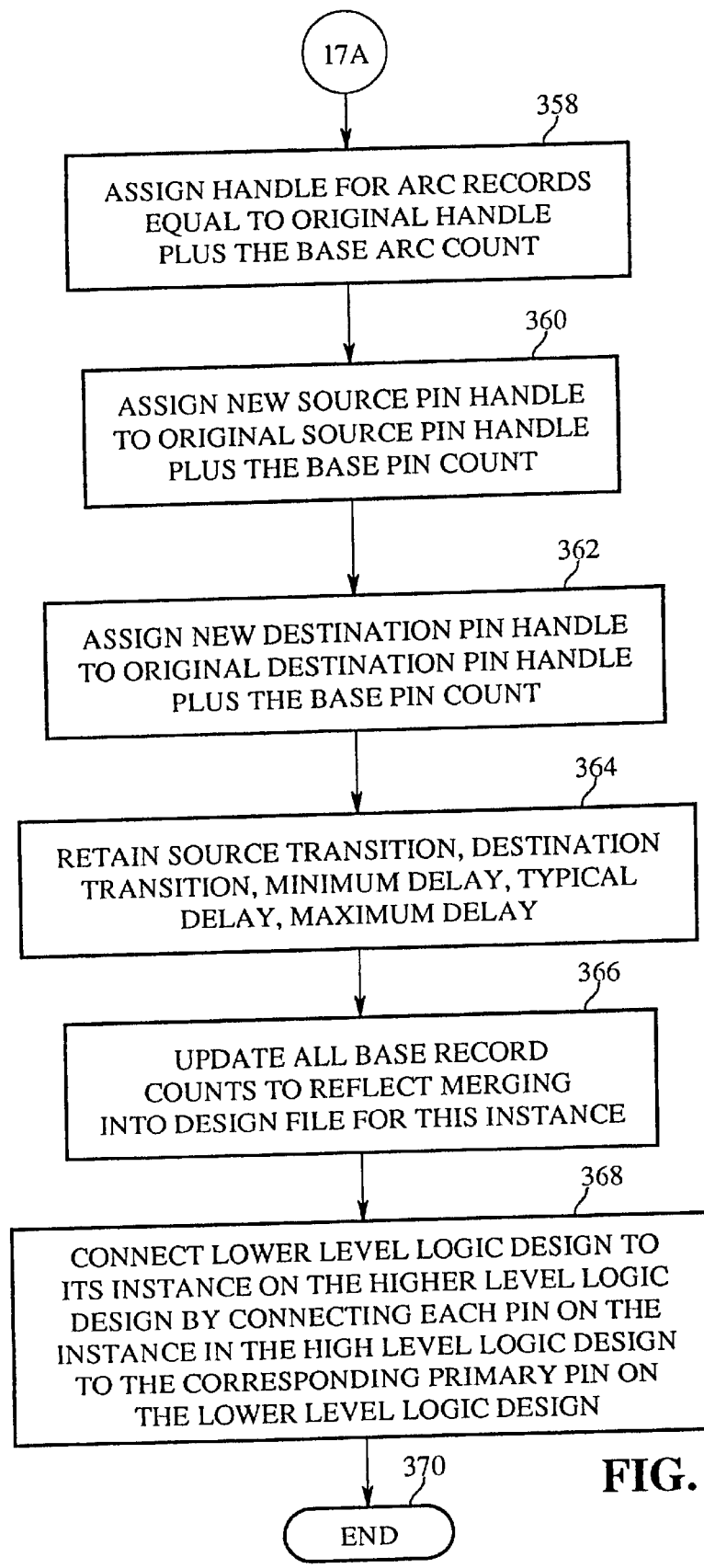

FIG. 15 through FIG. 17 are flow charts showing the steps for merging lower level design records into a higher level logic design. The order that lower level design records are merged into the higher level logic design is Instance, Net, Pin, and then Arc. After Start Step 332, handles are assigned for Instance records from the lower level logic design being merged into the higher level logic design equal to their original handle plus the base Instance count at Step 334. At Step 336, a new Instance name is assigned to each Instance record. The new name is the original Instance name prefixed by the Instance name of the Instance in the higher level logic design followed by a period ("."). The period is a hierarchical name separator token. At Step 338, the First Pin On Instance field is assigned to its original value plus the base Pin count. Net records are processed next. Next, at Step 340, the Net records from the lower level logic design being merged into the higher level logic design are assigned a handle equal to their original handle plus the base Net count. At Step 342, the new Net name is assigned as the original Net name prefixed by the Instance name of the Instance in the higher level logic design followed by a period. At Step 344, the new First Pin On Net field is assigned to the original value plus the base Pin count. Merge processing continues on FIG. 16 via connector 16A.

Pin records are processed next. Turning now to FIG. 16, processing continues at Step 346. At this step, the Pin records from the lower level logic design being merged into the higher level logic design are assigned a handle equal to its original handle plus the base Pin count. At Step 348, the new Pin name is assigned to the old Pin name prefixed by the Instance name of the Instance in the higher level logic design followed by a period. Next, at Step 350, the new Parent Instance handle is assigned to the original Parent Instance handle plus the base Instance count. The new Parent Net handle is then assigned to the original Parent Net handle plus the base Net count at Step 352. At Step 354, the new Next Pin On Instance field is assigned to its original value plus the base Pin count. At Step 356, the new Next Pin On Net field is assigned to its original value plus the base Pin count. The First Source Arc and First Destination Arc values are determined later when Arcs are linked as in Step 312 of FIG. 13. Processing continues on FIG. 17 via connector 17A.

Arc records are processed last. At Step 358 on FIG. 17, the Arc records from the lower level logic design being merged into the higher level logic design are assigned a handle equal to their original handle plus the base Arc count. At Step 360, the New Source Pin handle is assigned to the original Source Pin handle plus the base Pin count. Next, at Step 362, the new Destination Pin handle is assigned to the original Destination Pin handle plus the Base pin count. At Step 364, the Source Transition, Destination Transition, Minimum Delay, Typical Delay, and Maximum Delay fields are retained because they remain valid. The Next Destination Arc For Source Pin fields and Next Source Arc For Destination Pin fields are determined later when Arcs are linked as in Step 314 of FIG. 13. At Step 366, all base record counts are updated to reflect that all of the records merged into the Design File for the current Instance have been processed. Finally, at Step 368, the interfacing between the lower level logic design and its Instance on the higher level logic design is performed. This is done by connecting each Pin on the Instance in the higher level logic design to the corresponding primary Pin on the lower level logic design. The primary Pins in the lower level logic design reside on an Instance called the "interface" Instance. Each Pin pair is connected by creation of Propagation Arcs containing zero delay. When each Arc is created, its handle is assigned to be the Arc base count plus one and the Arc base count is incremented by one. Merge processing ends at End Step 370.

Using composite Design Files created with the Delete Internal Circuitry and Substitute functions, timing analysis can be performed across hierarchical boundaries of logic design. Timing analysis can be performed for nets which can be traced from a lower-level design into the next higher-level design. Since actual net information is retained from the lower-level lists (for example, actual ASIC net names are reflected in the combined netlist shown in FIG. 12), timing violations can be pin-pointed without manually cross-referencing other netlists. Moreover, less memory is needed to complete processing of timing analysis because the Design Files are now much smaller in size.

The functions embodied in the present invention may be used to analyze timing across any of the hierarchical boundaries existing within a system, including ASIC subsection to ASIC, ASIC to multi-chip module, ASIC to printed circuit board, and printed circuit board to backpanel.

The invention has been described in its presently contemplated best mode, and clearly it is susceptible to various modifications, modes of operation and embodiments, all within the ability and skill of those skilled in the art and without the exercise of further inventive activity. Accordingly, what is intended to be protected by Letters Patent is set forth in the appended claims.

We claim:

1. A computer-implemented method of compacting the detailed logic design data representation of a hierarchical multi-level logic design, the hierarchical multi-level logic design having at least one higher level logic design including multiple instances of a lower level logic design, comprising the steps of:

(a) deleting selected logic design data from the data representation of the lower level logic design, said selected logic design data including all paths and all components not connected to the higher level logic design; and (b) substituting detailed logic design data remaining for the lower level logic design into instances of the lower level logic design in the logic design data from the data representation of the higher level logic design, thereby resulting in a compacted data representation for the hierarchical multi-level logic design.

2. In an electronic design automation system for designing integrated circuits, a system for compacting the data representation of a hierarchical multi-level logic design, the hierarchical multi-level logic design having at least one higher level logic design including multiple instances of a lower level logic design, the system comprising:

means for deleting selected logic design data from the data representation of the lower level logic design, said selected logic design data including all paths and all components not connected to the higher level logic design; and means for substituting logic design data remaining for the lower level logic design into instances of the lower level logic design in the logic design data from the data representation of the higher level logic design, thereby resulting in a compacted data representation for the hierarchical multi-level logic design.

3. A computer-implemented method of compacting the data representation of a hierarchical multi-level logic design, the hierarchical multi-level logic design having at least one higher level logic design including multiple instances of a lower level logic design, comprising the steps of:

(a) creating a first electronic file for storing logic design data defining the data representation of a lower level logic design and for storing timing analysis input data for the lower level logic design;

(b) deleting selected logic design data from the data representation of the lower level logic design in said first electronic file, said selected logic design data including all paths and all components not connected to the higher level logic design;

(c) repeating steps (a) and (b) for all lower level logic designs defined in the hierarchical multi-level logic design;

(d) creating a second electronic file for storing logic design data defining the data representation of a higher level logic design and for storing timing analysis input data for the higher level logic design; and (e) substituting logic design data remaining for the lower level logic design stored in said first electronic files into instances of the lower level logic design occurring in the data representation of the higher level logic design stored in said second electronic file, thereby resulting in a compacted hierarchical multi-level logic design.

4. In an electronic design automation system used for designing integrated circuits, the integrated circuits including nets, combinational logic components, state devices, and paths, each of the paths comprising nets and combinational logic components interconnecting two respective state devices, a system for compacting the data representation of a hierarchical multi-level logic design, the hierarchical multi-level logic design having at least one higher level logic design including multiple instances of a lower level logic design, the system comprising:

first file creation means for creating a first electronic file for storing logic design data defining the data representation of a lower level logic design and for storing timing analysis input data for the lower level logic design;

means for deleting selected logic design data from the data representation of the lower level logic design in said first electronic file, said selected logic design data including all paths not connected to the higher level logic design;

second file creation means for creating a second electronic file for storing logic design data defining the data representation of a higher level logic design and for storing timing analysis input data for the higher level logic design; and means for substituting logic design data remaining for the lower level logic design stored in said first electronic files into instances of the lower level logic design occurring in the data representation of the higher level logic design stored in said second electronic file, thereby resulting in a compacted hierarchical multi-level logic design.

5. A computer-implemented method of compacting the data representation of a hierarchical multi-level logic design and for performing static timing analysis on the hierarchical multi-level logic design, the hierarchical multi-level logic design having at least one higher level logic design including multiple instances of a lower level logic design comprising the steps of:

(a) obtaining logic design data defining the data representation of the lower level logic design;

(b) creating a first electronic file for storing said logic design data and timing analysis input data for the lower level logic design;

(c) performing static timing analysis on the lower level logic design;

(d) deleting selected logic design data from the data representation of the lower level logic design in said first electronic file, said selected logic design data including all paths and all components not connected to the higher level logic design;

(e) repeating steps (a) through (d) for all lower level logic designs defined in the hierarchical multi-level logic design;

(f) obtaining logic design data defining the data representation of the higher level logic design;

(g) creating a second electronic file for storing logic design data and timing analysis input data for the higher level logic design;

(h) substituting the logic design data remaining for the lower level logic design stored in said first electronic files into instances of the lower level logic design occurring in the data representation of the higher level logic design stored in said second electronic file, thereby resulting in a compacted hierarchical multi-level logic design; and (i) performing static timing analysis on said compacted hierarchical multi-level logic design.

6. A computer-implemented method of compacting the data representation of a hierarchical multi-level logic design and for performing static timing analysis on the hierarchical multi-level logic design, the hierarchical multi-level logic design having at least one higher level logic design including multiple instances of a lower level logic design, comprising the steps of:

(a) obtaining logic design data defining the data representation of the lower level logic design;

(b) creating a first electronic file for storing said logic design data and timing analysis input data for the lower level logic design;

(c) obtaining timing model data, technology parameters, and resistance and capacitance data for the lower level logic design;

(d) performing delay calculations for the lower level logic design and storing results of said delay calculations into said first electronic file;

(e) performing static timing analysis on the lower level logic design by using said logic design data, said timing analysis input data, and said delay calculation results from said first electronic file;

(f) deleting selected logic design data from the data representation of the lower level logic design in said first electronic file, said selected logic design data including all paths and all components not connected to the higher level logic design;

(g) repeating steps (a) through (f) for all lower level logic designs defined in the hierarchical multi-level logic design;

(h) obtaining logic design data defining the data representation of the higher level logic design;

(i) creating a second electronic file for storing logic design data and timing analysis input data for the higher level logic design;

(j) substituting the logic design data remaining for the lower level logic design stored in said first electronic files into instances of the lower level logic design in the data representation of the higher level logic design stored in said second electronic file, thereby resulting in a compacted hierarchical multi-level logic design; and (k) performing static timing analysis on said compacted hierarchical multi-level logic design.

7. A computer-implemented method of compacting a detailed data representation of a logic design containing logic structures including nets, combinational logic, and state devices, the method comprising the steps of:

(a) identifying first portions of the logic design to be abbreviated and second portions of the logic design to be retained;

(b) identifying ones of the logic structures within said each of said first portions;

(c) tracing through the logic design to identify paths interconnecting any of said identified ones of the logic structures to any of said second portions of the logic design;

(d) creating a respective abbreviated data representation for each of said first portions by retaining respective ones of the logic structures identified in step (b), further retaining respective ones of said interconnecting paths identified in step (c), and deleting all other paths; and (e) substituting each of said abbreviated data representations into the data representation of the logic design to replace said each respective one of said first portions of the logic design.

8. The method of claim 7 wherein the data representation of the logic design is hierarchical and includes lower level hierarchical structures encompassed by higher level hierarchical structures, and said each of said first portions of the logic design is bounded by a boundary between an associated one of said lower level hierarchical structures and an associated one of said higher level hierarchical structures.

9. The method of claim 7 wherein for each of said first portions, said tracing step comprises the steps of:

(b1) identifying all nets that cross a boundary between said first portion and one or more of said second portions;

(b2) tracing, within said first portion, each of said identified nets, combinational logic connected to said each of said identified nets, and nets interconnected to said combinational logic, to locate output ones of the state devices having stored states which are capable of directly affecting the logic level of one or more of said identified nets, and wherein said output ones of the state devices are ones of said identified ones of the logic structures; and (b3) tracing, within said first portion, each of said identified nets, combinational logic connected to said each of said identified nets, and nets interconnected to said combinational logic, to locate input ones of the state devices having stored states which are capable of being directly affected by the logic states of one or more of said identified nets, and wherein said input ones of the state devices are ones of said identified ones of the logic structures.

10. In an electronic design automation system used for creating and testing logic designs having nets, combinational logic, and state devices, a system for selectively deleting portions of a logic design to facilitate testing of other portions of the logic design, the system comprising:

identifying means for identifying first portions of the logic design to be compacted and for identifying second portions of the logic design to be maintained in full;

retaining means for selectively retaining a portion of the logic design included within each of said first portions, each of said retained portions including predetermined nodes of the circuit, and further including all nets, combinational logic, and state devices that provide an interconnection between a respective one of said predetermined nodes of the circuit and any of said second portions, said retaining means for deleting all other ones of the nets, combinational logic, and state devices included within any one of said first portions and not included within any one of said retained portions; and substitution means for substituting each of said retained portions into the data representation of the logic design to replace said respective one of said first portions of the logic design.

11. The system of claim 10 wherein the data representation of the logic design is hierarchical and includes lower level hierarchical structures included within one or more higher level hierarchical structures, and wherein said identifying means identifies each of said first portions such that each of said first portions is bounded by a boundary between an associated one of said lower level hierarchical structures and one of said one or more higher level hierarchical structures.

12. The system of claim 10 wherein said retaining means further comprises:

net identifying means for identifying all nets within each of said first portions that cross a boundary between each of said first portions and an associated one of said second portions;

logic tracing means for locating within each of said first portions output ones of the state devices having stored states which are capable of directly affecting the logic level of one or more of said identified nets, and for further locating within each of said first portions input ones of the state devices having stored states which are capable of being directly affected by the logic states of one or more of said identified nets; and logic selection means for retaining logic from each of said first portions in a respective one of said retained portions, said retained logic including said identified nets, said output ones of the state devices, combinational logic and nets interconnecting said output ones of the state devices to said identified nets, said input ones of the state devices, and combinational logic and nets interconnecting said input ones of the state devices to said identified nets.

13. A computer-implemented method of compacting a logic design prior to performing timing analysis on the logic design, by selectively temporarily removing a portion of the logic design wherein the logic design comprises a circuit representation of interconnecting logical structures of a circuit, the method comprising the steps of:

(a) identifying a first portion of the logic design to be compacted and a second portion of the logic design to be retained in full;

(b) identifying predetermined ones of the logical structures within said first portion of the logic design;

(c) identifying all logic paths which interconnect any of said predetermined ones of the logical structures to said second portion of the logic design;

(d) creating a compacted representation of said first portion of the logic design by retaining said all logic paths identified in step (c) and all of said predetermined ones of the logical structures identified in step (b), and deleting all other circuitry included in said first portion; and (e) merging said compacted representation of said first portion of the logic design with said second portion of the logic design to form a merged representation of the logic design.

14. The method of claim 13, wherein the logical structures of the logic design include nets, components, and state devices, and wherein identifying step (b) identifies each of said predetermined ones of the logical structures as being state devices.

15. The method of claim 13, wherein the logic design includes different hierarchical logic levels, and wherein said first portion of the logic design is at a lower hierarchical logic level than is said second portion of the logic design.

16. The method of claim 13, wherein step (a) further includes performing timing analysis on said first portion of the logic design.

17. The method of claim 13, and further including the step of performing timing analysis on said merged representation of the logic design.

18. The method of claim 13 wherein a predetermined multiple number of instances of said first portion of the logic design is included within the logic design, and wherein the merging step (e) merges said predetermined multiple number of instances of said compacted representation of said first portion of the logic design with said second portion of the logic design.

19. A computer-implemented method of compacting a data representation of a logic design containing logical structures including nets, combinational logic, and state devices, the method comprising the steps of:

(a) identifying first portions of the logic design to be compacted and second portions of the logic design to be retained;

(b) identifying all nets that cross a boundary between a respective one of said first portions and a respective one of said second portions;

(c) tracing, within each of said first portions, respective logical structures including each respective one of said identified nets, any combinational logic connected to said each respective one of said identified nets, and any nets interconnected to traced combinational logic, state devices having stored states which are capable of directly affecting the logic level of any respective ones of said identified nets, and state devices having stored states which are capable of being directly affected by the logic levels of said any respective one of said identified nets;

(d) creating a compacted representation for each of said first portions by retaining all said respective circuits traced in step (c); and (e) substituting each compacted representation into the data representation of the logic design to replace a respective one of said first portions of the logic design.

20. In an electronic design automation system used for creating and testing logic designs having nets, combinational logic, and state devices, a system for selectively deleting portions of a logic design to facilitate testing of other portions of the logic design, the system comprising:

identifying means for identifying first portions of the logic design to be compacted and for identifying second portions of the logic design to be maintained in full;

net identifying means for identifying all nets within each of said first portions that cross a boundary between each of said first portions and an associated one of said second portions;

state device identifying means for identifying, within each of said first portions, ones of the state devices having stored states which are capable of directly affecting the logic level of one or more of said identified nets, and for further identifying ones of the state devices having stored states which are capable of being directly affected by the logic states of one or more of said identified nets; and logic selection means for retaining logic from each of said first portions in a respective one of said retained portions, each of said retained portions including respective ones of said identified nets, respective ones of said identified state devices, and combinational logic and nets interconnecting said respective ones of said identified state devices with said respective one of said identified nets; and substitution means for substituting each of said retained portions into the data representation of the logic design to replace said respective one of said first portions of the logic design.

* * * * *